US012772809B2

(12) United States Patent
Lin et al.

(10) Patent No.: US 12,772,809 B2
(45) Date of Patent: Oct. 20, 2026

(54) METHOD FOR FABRICATING MASK

(71) Applicant: TAIWAN SEMICONDUCTOR MANUFACTURING COMPANY, LTD., Hsinchu (TW)

(72) Inventors: Ping-Hsun Lin, New Taipei City (TW); Hung-Yi Tsai, Hsinchu County (TW); Hao-Ping Cheng, Taichung City (TW); Ta-Cheng Lien, Hsinchu County (TW); Hsin-Chang Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1101 days.

(21) Appl. No.: 17/836,820

(22) Filed: Jun. 9, 2022

(65) Prior Publication Data

US 2023/0402283 A1 Dec. 14, 2023

(51) Int. Cl.

*G03F 1/70* (2012.01)
*H10P 50/00* (2026.01)
*H10P 50/26* (2026.01)
*H10P 74/00* (2026.01)
*H10P 76/40* (2026.01)

(52) U.S. Cl.

CPC ........ *H10P 76/4085* (2026.01); *H10P 50/266* (2026.01); *H10P 50/71* (2026.01); *H10P 74/23* (2026.01)

(58) Field of Classification Search

CPC ........... G03F 1/70; G03F 1/36; H10P 76/4088
See application file for complete search history.

(56) References Cited

U.S. PATENT DOCUMENTS

2011/0217633 A1* 9/2011 Hosoya ..................... G03F 1/24 430/5
2018/0365370 A1* 12/2018 Egan ................... G06F 3/04847
2019/0250501 A1* 8/2019 Sriraman .................. G03F 1/80

* cited by examiner

*Primary Examiner* — Daborah Chacko-Davis
(74) *Attorney, Agent, or Firm* — Maschoff Brennan

(57) ABSTRACT

A method for fabricating a mask is provided. The method includes depositing a target layer over a dielectric substrate; forming a patterned photoresist layer over the target layer according to an integrated circuit (IC) layout; determining a plurality of dry etch control parameters according a material of the target layer and an information of the IC layout; and using a dry etcher set up with the dry etch control parameters, etching the target layer through the patterned photoresist layer.

20 Claims, 19 Drawing Sheets

METHOD FOR FABRICATING MASK

BACKGROUND

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light, is a promising next-generation lithography solution for emerging technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
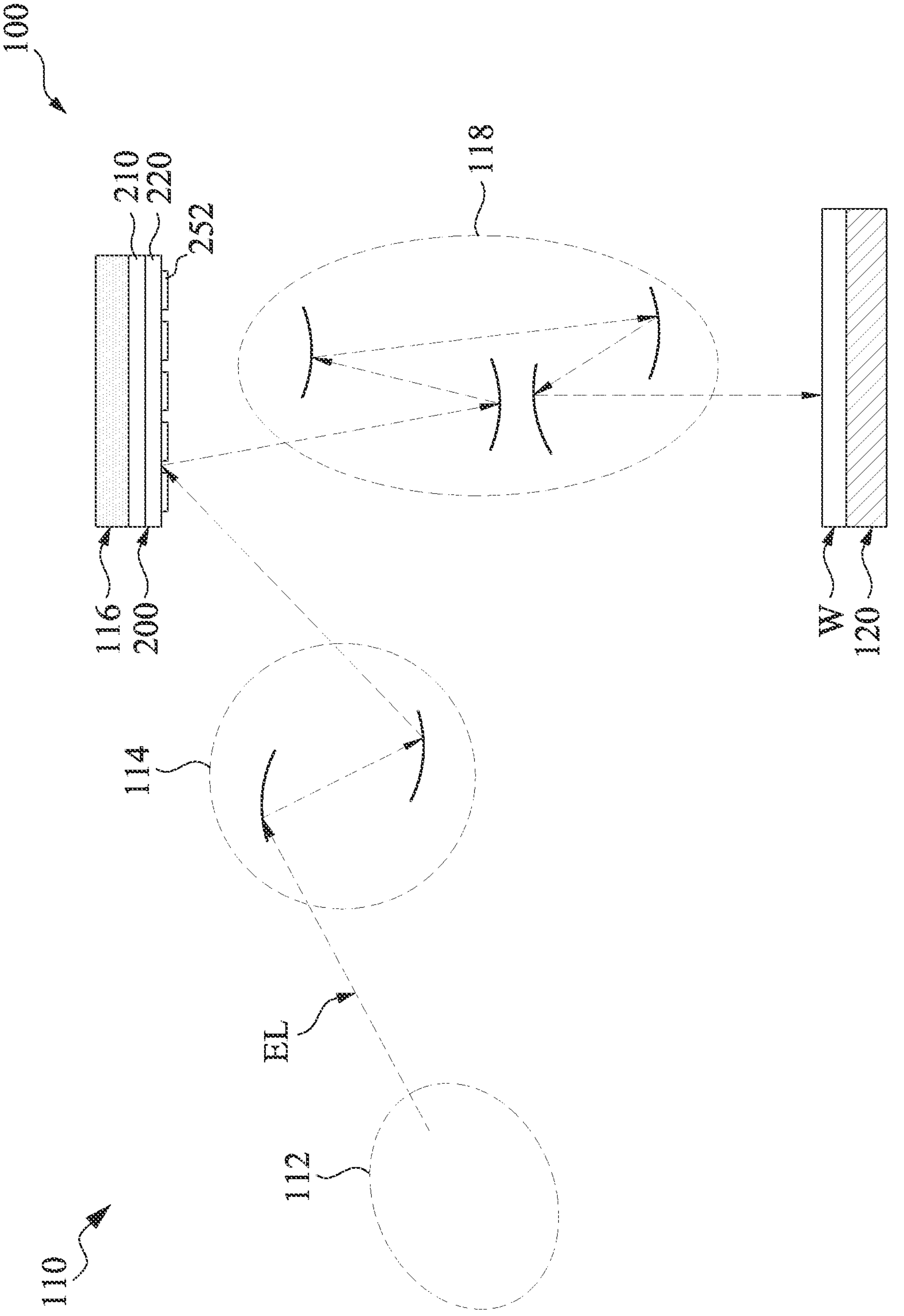
FIG. 1 is a schematic view of a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a lithography system 100 according to some embodiments of the present disclosure. The lithography system 100 includes an exposure tool 110 and a stage 120. The exposure tool 110 is used to perform a lithography exposure process to a resist layer coated on the wafer W. The stage 120 holds the wafer W.

The exposure tool 110 include a radiation source 112 and a reticle (also referred to as a mask or a photomask) 200. The radiation source 112 is configured to provide a radiation energy to the wafer W. The reticle 200 is configured to provide the radiation energy from the radiation source 112 with a pattern. In some embodiments, the radiation source 112 may be any radiation source suitable for exposing a resist layer. In some embodiments, the lithography system 100 is an EUV lithography system, the radiation source 112 may include a light source selected from the group consisting of ultraviolet (UV) source, deep UV (DUV) source, extreme UV (EUV) source, and X-ray source. In some alternative embodiments, the lithography system 100 is a transmissive optical lithography system, the radiation source 112 may include a light source having a longer wavelength than EUV.

In some embodiments where the lithography system 100 is an EUV lithography system, the reticle 200 is a reflective mask. One exemplary structure of the reticle 200 includes a substrate 210 with a low thermal expansion material (LTEM). For example, the LTEM may include $TiO_2$ doped $SiO_2$, or other suitable materials with low thermal expansion. The reticle 200 includes a reflective multi-layer 220 deposited on the substrate 210. The reflective multi-layer (ML) 220 includes plural film pairs, such as molybdenum-silicon (Mo/Si) film pairs (e.g., a layer of molybdenum above or below a layer of silicon in each film pair). Alternatively, the reflective multi-layer 220 may include molybdenum-beryllium (Mo/Be) film pairs, or other suitable materials that are configurable to highly reflect the EUV light EL. The reticle 200 further includes a light-shielding layer 252, such as a tantalum layer or tantalum boron nitride (TaBN) layer, deposited over the reflective multi-layer. The light-shielding layer 252 is patterned to have an opaque pattern, which defines a layer of an integrated circuit (IC).

In some embodiments where the lithography system 100 is the transmissive optical lithography system, the reticle 200 is a transmissive mask. For example, the reticle 200 includes a transparent substrate and a patterned light absorption layer. The transparent substrate may use fused silica ($SiO_2$) relatively free of defects, such as borosilicate glass and soda-lime glass. The light absorption layer may include a metal film such as chromium (Cr) for absorbing light directed thereon. The light absorption layer is further patterned to have one or more openings in the metal film through which a light beam may travel without being completely absorbed. The reticle 200 may have other structures or configurations in various embodiments. In this context, the terms mask, photomask, and reticle are used interchangeably. The exposure tool 110 may also include a mask stage (e.g., electrostatic chuck) 116 configured to secure the reticle 200.

The exposure tool 110 may also employ various optical modules, such as an illuminator 114 and a projection optics module (or projection optics box (POB)) 118. In some embodiments, the illuminator 114 includes various reflective optics such as a single mirror or a mirror system having multiple mirrors in order to direct the light EL from the radiation source 112 onto the mask stage 116, particularly to the reticle 200 secured on the mask stage 116. The light EL that is directed from the reticle 200 and carries the image of the pattern defined on the reticle 200 is collected by the POB 118. The POB 118 includes reflective optics in the present embodiments. The POB 118 is configured for imaging the pattern of the reticle 200 onto a semiconductor substrate W secured on the stage 120.

Figure 2:
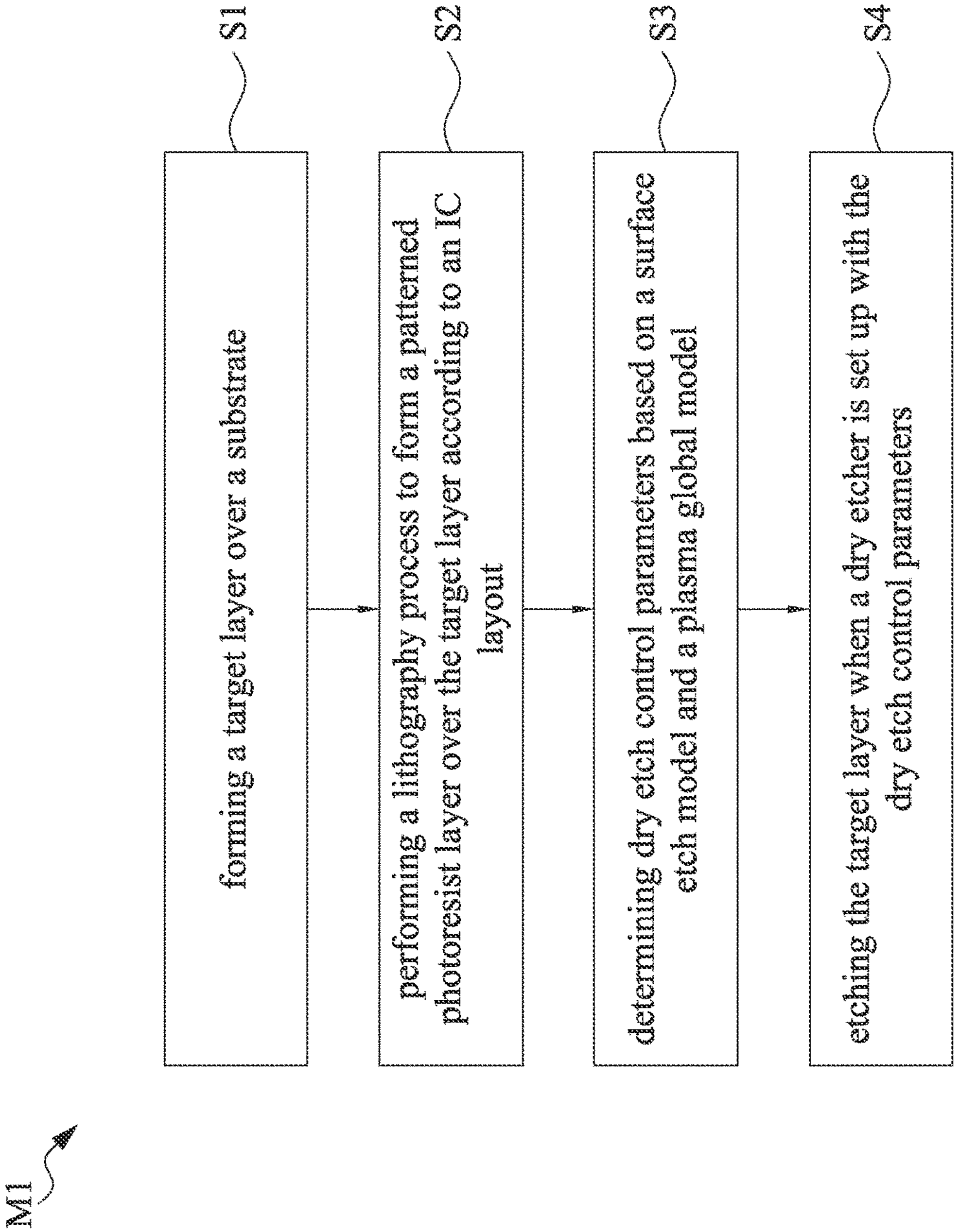
FIG. 2 is a flow chart of a method for fabricating a reticle used in the lithography system according to some embodiments of the present disclosure.

FIG. 2 is a flow chart of a method M1 for fabricating the reticle 200 used in the lithography system 100 (referring to FIG. 1) according to some embodiments of the present disclosure. FIGS. 4-7 are cross-sectional views illustrating a method for fabricating the reticle 200 used in the lithography system 100 (referring to FIG. 1) according to some embodiments of the present disclosure. The method M1 may include steps S1-S4. At step S1, a target layer is formed over a substrate. At step S2, a lithography process is performed to form a patterned photoresist layer over the target layer according to an integrated circuit (IC) layout. At step S3, dry etch control parameters are determined based on a surface etch model and a plasma global model. At step S4, the target layer is etched when a dry etcher is set up with the dry etch control parameters. It is understood that additional steps may be provided before, during, and after the steps S1-S4 shown in FIG. 2, and some of the steps described below can be replaced or eliminated for additional embodiments of the method. The order of the operations/processes may be interchangeable.

Figure 4:
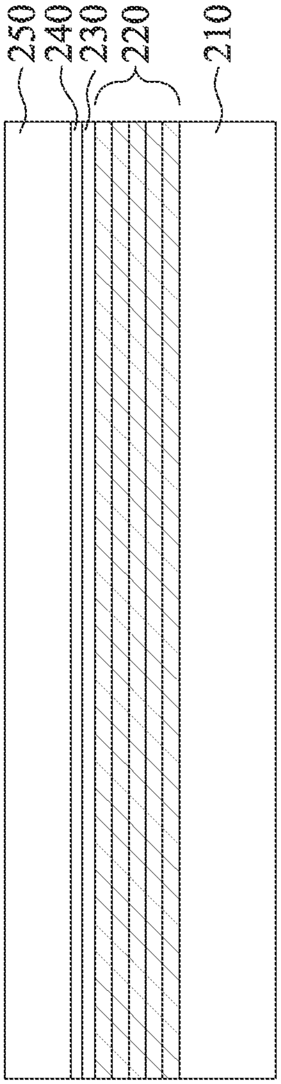
FIGS. 4-7 are cross-sectional views illustrating a method for fabricating a reticle used in the lithography system according to some embodiments of the present disclosure.

Reference is made to FIG. 2 and FIG. 4. The method M1 begins at step S1, where a target layer is formed over a substrate 210. The substrate 210 may be a dielectric substrate. In some embodiments, for the EUV lithography system, the substrate 210 may be a low thermal expansion material (LTEM). The LTEM material may include $TiO_2$ doped $SiO_2$, and/or other low thermal expansion materials. The LTEM substrate 210 serves to minimize image distortion due to mask heating. In addition, a conductive layer (e.g., CrN) may be deposited under the LTEM substrate 210 for the electrostatic chucking purpose. In some embodiments, the substrate 210 may be a transparent substrate for the transmissive optical lithography system. In some embodiments, the substrate 210 may have a shape of rectangular, such as square. In some embodiments, the substrate 210 may have a length dimension ranging from about 4 inches to about 8 inches, and a thickness ranging from about 0.15 inch to about 0.35 inch. In some other embodiments, the substrate 210 may have other suitable length dimension and other suitable thickness.

In some embodiments, for the EUV lithography system where the reticle uses reflective mechanism, a reflective multi-layer 220 may be deposited over the substrate 210. The reflective multi-layer 220 may include plural film pairs, such as molybdenum-silicon (Mo/Si) film pairs (e.g., a layer of molybdenum above or below a layer of silicon in each film pair). Alternatively, the reflective multi-layer may include molybdenum-beryllium (Mo/Be) film pairs, or any two materials or two material combinations with large difference in refractive indices and small extinction coefficients. The thickness of each layer of the reflective multi-layer depends on the wavelength and the angle of incidence of the incident light. For a specified angle of incidence, the thickness of each layer of the reflective multi-layer is adjusted to achieve maximal constructive interference for lights reflected at different interfaces of the reflective multi-layer.

A capping layer 230 may be formed above the reflective multi-layer 220 to prevent oxidation of the reflective multi-layer. In some embodiments, the capping layer 230 includes silicon. A buffer layer 240 may be formed above the capping layer 230 to act as an etching stop layer in a patterning or repairing process of a light absorption layer. The buffer layer 240 has different etching characteristics from the light-shielding layer 250. The buffer layer 240 includes ruthenium (Ru), Ru compounds such as RuB, RuSi, chromium (Cr), Cr oxide, and Cr nitride. The buffer layer 240 may be deposited by a low temperature deposition process for avoiding inter-diffusion of the reflective multi-layer 220.

A light-shielding layer 250 may be deposited over the buffer layer 240. The light-shielding layer 250 has different etching characteristics from the buffer layer 240. In some embodiments, the light-shielding layer 250 may be a light absorption layer capable of absorbing light directed thereon. For example, at the operating wavelength range of the lithography system 100 (referring to FIG. 1), a transmittance of the light-shielding layer 250 is lower than about 40%, or even lower than about 20%. For example, at the operating wavelength range of the lithography system 100 (referring to FIG. 1), an absorbance of the light-shielding layer 250 is greater than about 60%, or even greater than about 80%. The light-shielding layer 250 may include a metal film such as tantalum (Ta), the like, or the combination thereof for absorbing light directed thereon. In the present embodiments, the light-shielding layer 250 may serve as the target layer. In some alternative embodiments (illustrated later in FIGS. 10-12), a hard mask layer formed over the light-shielding layer 250 may serve as the target layer. For example, the hard mask layer may include silicon or silicon-based material (e.g., silicon nitride or silicon oxide). In some still alternative embodiments where the reticle does not include the light-shielding layer 250, the reflective multi-layer 220 may serve as the target layer.

One or more of the layers 220, 230, 240, and 250 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), the like and/or other methods.

Figure 5:
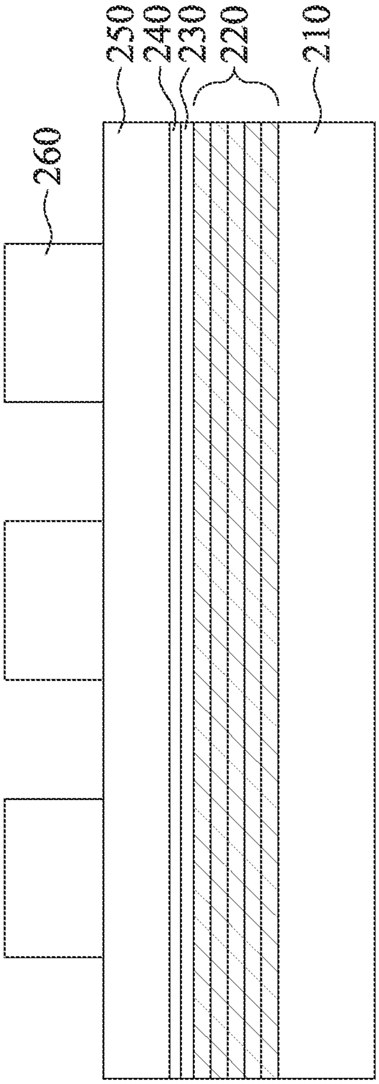

Reference is made to FIG. 2 and FIG. 5. The method M1 proceeds to step S2, where a lithography process is performed to form a patterned photoresist layer 260 over the target layer (e.g., the light-shielding layer 250). The lithography process may include resist coating (e.g., spin-on coating), soft baking, exposure, post-exposure baking, developing the resist, rinsing, drying (e.g., hard baking), other suitable processes, and/or combinations thereof. The exposure may include a maskless exposure process, such as laser exposure, electron beam direct writing, or multiple electron beam direct writing. In some embodiments, an IC layout is obtained and/or determined prior the lithography process, and the exposure of the lithography process is performed according to the IC layout, thereby providing a light pattern to the resist.

Figure 6:
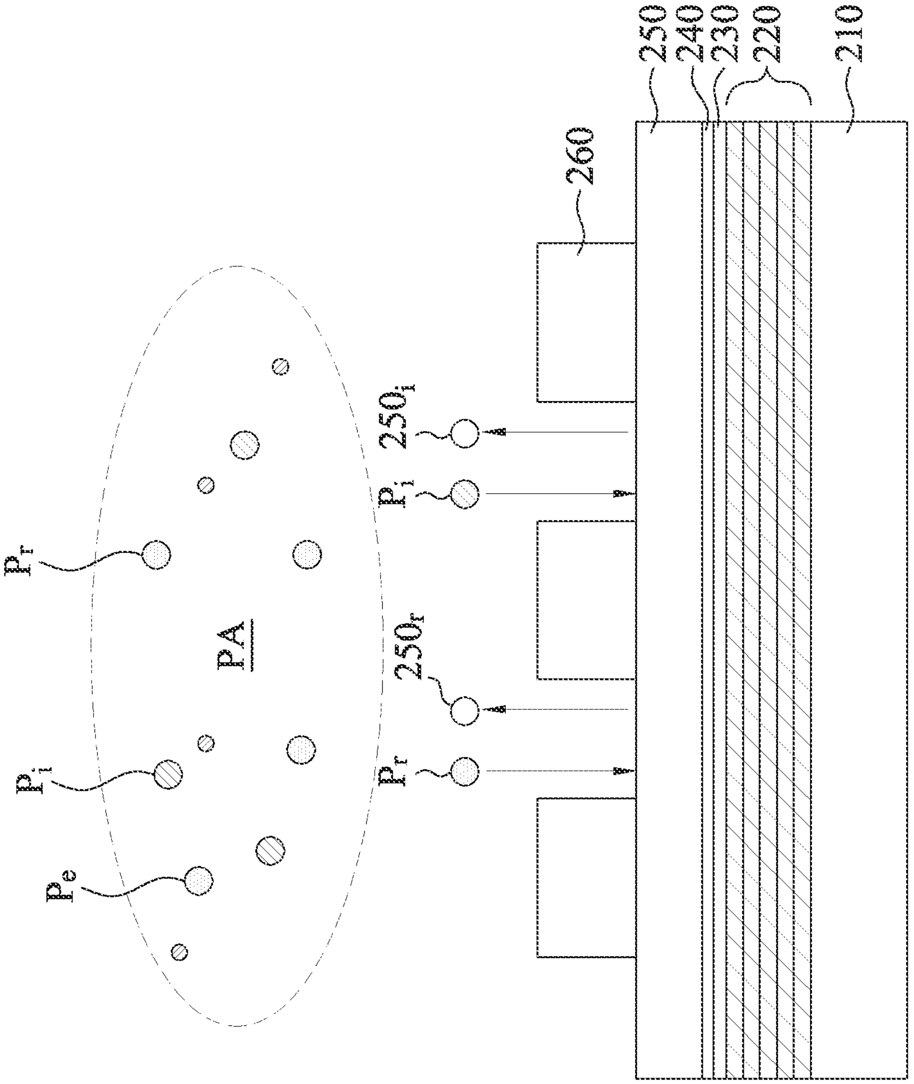

Reference is made to FIG. 2 and FIG. 6. The method M1 proceeds to step S3, dry etch control parameters are determined based on a surface etch model and a plasma global model. Subsequently, the method M1 proceeds to step S4, the target layer (e.g., the light-shielding layer 250) is etched when a dry etcher is set up with the dry etch control parameters. In the present embodiments, the dry etcher generates plasma PA to etch the light-shielding layer 250. The plasma PA may include various species, such as negative electrons $P_e$, neutral radicals $P_r$, and positive ions $P_i$. The neutral radicals $P_r$ may be impinged on the light-shielding layer 250, and the impinge of the neutral radicals $P_r$ may lead to desorption of volatile byproduct $\mathbf{250}_R$. The positive ions $P_i$ may be impinged on the light-shielding layer 250, and the impinge of the positive ions $P_i$ on the light-shielding layer 250 may lead to ion-assisted desorption of volatile byproduct $\mathbf{250}_i$. When the light-shielding layer 250 is made of tantalum, the byproduct $\mathbf{250}_R$ and $\mathbf{250}_i$ may be $TaCl_5$. The plasma PA may further include other species, such as negative ions, and not specifically shown herein. Through the plasma global model and the surface etch model, the dry etch control parameters can be theoretically optimized at the early stage as a etch process optimization method M2 illustrated in FIG. 3.

Figure 3:
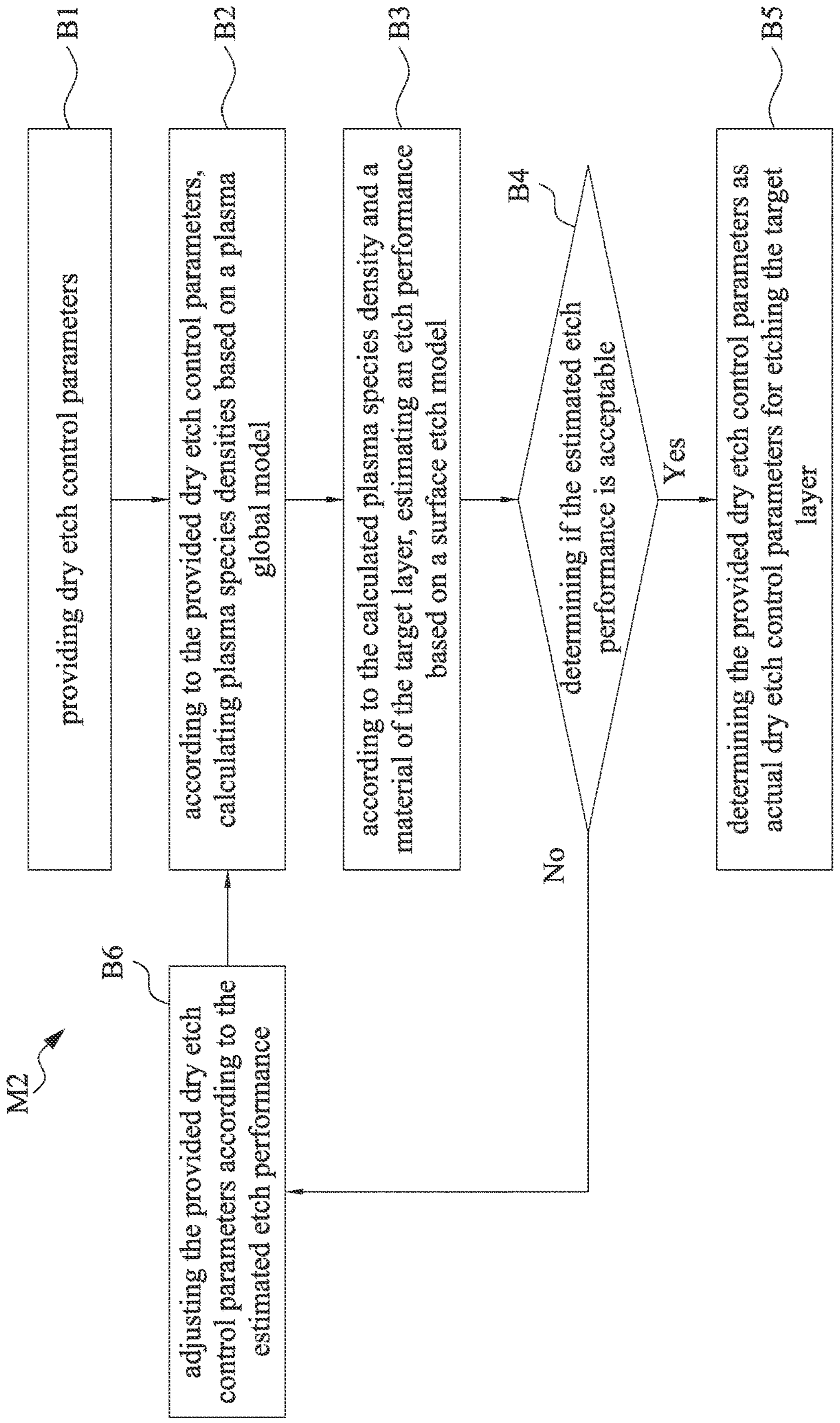
FIG. 3 is a block diagram for etch process optimization method according to some embodiments of the present disclosure.

FIG. 3 is a block diagram for etch process optimization method M2 according to some embodiments of the present disclosure. The etch process optimization method M2 includes steps B1-B6. At step B1, dry etch control parameters are provided. At step B2, according to the provided dry etch control parameters, plasma species densities are calculated based on a plasma global model. At step B3, according to the calculated plasma species density and a material of the target layer, an etch performance is estimated based on a surface etch model. At step B4, a determination is made if the estimated etch performance is acceptable. At step B5, if the etch performance is acceptable, the provided dry etch control parameters is used as actual dry etch control parameters for etching the target layer. At step B6, if the etch performance is not acceptable, the provided dry etch control parameters are adjusted according to the estimated etch performance, and the method M2 returns to the step B2. It is understood that additional steps may be provided before, during, and after the steps B1-B6 of the method M2 shown in FIG. 3, and some of the steps described below can be replaced or eliminated for additional embodiments of the method. The order of the operations/processes may be interchangeable.

The method M2 begins at step B1 where dry etch control parameters are provided. In some embodiments, the provided dry etch control parameters may be called initial dry etch control values/parameters. The provided dry etch control parameters may include power (e.g., continuous waves), pressure, gas flow, gas type, pulses, and substrate bias. A suitable etch gas type may be prepared and chosen according to a material of the target layer (e.g., light-shielding layer 250). Etch gas may include one or more types of active gases and addictive gases. The active gases may dissociate in the plasma creating a large concentration of this element in an excited state which will react with the material of the target layer (e.g., light-shielding layer 250) while reacting minimally with materials that is not to be etched (e.g., the material of the patterned photoresist layer 260 and/or the material of the buffer layer 240), thus achieving etch selectivity. The addictive gases are added with the active gases in order to shift the concentration of reactive elements, thereby adjust the concentration of free radicals (reactive species) in the plasma, which in turn will improve the selectivity or directionality, enhance the reactivity, or some other function. In some examples where the target layer (e.g., the light-shielding layer 250) is made of tantalum, the active gases may include chlorine-based gas etchant. In some examples where the target layer (e.g., the hard mask layer) is made of silicon, the active gases may include fluorine-based gas etchant or chlorine-based gas etchant. Suitable initial values are assigned to the power (e.g., continuous waves), the pressure, the pulses, the gas flow, and the substrate bias. The gas flow can adjust a gas ratio, for example, a gas ratio of the active gases and addictive gases. In some further embodiments, the initial value of the gas flow is also chosen according to the material of the target layer (e.g., light-shielding layer 250) and the materials that is not to be etched (e.g., the material of the patterned photoresist layer 260 and/or the material of the buffer layer 240).

The method M2 proceed to step B2. At step S2, according to the provided dry etch control parameters, plasma species densities are calculated based on a plasma global model. The plasma global model is used to predict number densities of various species/particles (e.g., ions, electrons, radical, or the like) in plasma during the dry etching. These number densities of various species/particles (e.g., ions, electrons, radical, or the like) in plasma may also be referred to as plasma species densities (e.g., ion (number) density, electron (number) density, radical (number) density, or the like) in the context. In present embodiments, the plasma global model is established with a particle balance formula and an energy balance formula. In some embodiments, other analytical methods may be used to establish the plasma global model. The particle balance formula is described as follows:

$$\frac{dn^i}{dt} = \sum_j GR_j^i - \sum_j LR_j^i$$

where GR is species generation rate, LR is species loss rate, and n is species (number) density, dn/dt is species density change rate. In the formula, i is an integer indicating different kinds of reactive species/particles (e.g., ions, radical, electrons, negative ions, the like, or the combination thereof), j is an integer indicating different kinds of the chemical reaction.

The species generation rate (GR) and the species loss rate (LR) can be described as follows:

$$GR = GK \times \prod_k n_k$$

$$LR = LK \times \prod_k n_k$$

where GK is a generation rate coefficient. LK is a loss rate coefficient. In the equations, k is an integer indicating different kinds of particles, including reactive particles and inert-reactive particles.

The energy balance formula is described as follows:

$$\frac{d}{dt}\left(\frac{3}{2}en_eT_e\right)=\frac{1}{V}(P_{in}-P_{loss})$$

where $T_e$ is electron temperature in volts, and $n_e$ is electron (number) density, and e is electron charge. V is plasma volume. $P_{in}$ is input power, which is controlled by the RF power supply 870 in FIG. 8. $P_{loss}$ is reaction energy loss.

Based on the plasma global model developed from the particle balance formula and the energy balance formula, the plasma parameters (e.g., the plasma density, the ion flux, the ion energy, and the plasma reaction rates) are calculated according to the provided dry etch control parameters (e.g., power (e.g., continuous waves), pressure, gas flow, gas type, pulses) at step B1. For example, the power (e.g., continuous waves) and pulses provided by the RF power supply 870 in FIG. 8 contributes to $P_{in}$. For example, the gas type contributes to generation rate coefficient and loss rate coefficient. For example, the pressure and gas flow contribute to species density change rate. As a result, plasma species (number) densities can be obtained and brought into subsequent model/formulas. For example, radical (number) density ($n_R$) and ion (number) density ($n_{ion}$) can be obtained and brought into subsequent etch rate formulas. In some embodiments, as the particle balance formula and the energy balance formula shown above, the material of the target layer (e.g., light-shielding layer 250) and the materials that is not to be etched (e.g., the material of the patterned photoresist layer 260 and/or the material of the buffer layer 240) are not considered in the plasma global model.

At step B3, according to the calculated plasma species density and the material of the target layer (e.g., light-shielding layer 250), an etch performance is estimated based on a surface etch model. The surface etch model is used to predict the shape after the dry etching. In the present embodiments, the surface etch model is established with a chemical etch rate formula and a reactive ion etch rate formula. In some other embodiments, the surface etch model may be established according to different process conditions using geometric method, analytical method, system identification method, basic principle simulation method, the like, or the combination thereof.

The chemical etch rate formula is described as follows:

$$\frac{1}{E_C}=\frac{n_M}{s_{act}}\left(\frac{1}{K_d}+\frac{1}{K_an_r}\right)$$

where $E_C$ is a chemical etch rate dominated by radicals, $n_R$ is radical (number) density and can be obtained from the plasma global model at step B2. In the formula, $n_M$ is a density of the target layer (e.g., a density of light-shielding layer 250), $K_a$ is a radical absorption rate of the target layer (e.g., the light-shielding layer 250), $K_d$ is a radical desorption rate of the target layer (e.g., the light-shielding layer 250), in which $n_M$, $K_a$, and $K_d$ can be obtained according to the material of the target layer (e.g., light-shielding layer 250) by datasheet. $S_{act}$ is a density of active sites regarding the material of the target layer (e.g., light-shielding layer 250) and temperature, and $S_{act}$ can be obtained by datasheet. For example, the neutral radicals $P_r$ is impinged on the target layer (e.g., light-shielding layer 250) by the radical adsorption rate ($K_a$), and the impinge of the neutral radicals $P_r$ may lead to desorption of volatile byproduct 250$_R$ by the radical desorption rate ($K_d$).

The reactive ion etch rate formula is described as follows:

$$\frac{1}{E_I}=\frac{n_M}{s_{act}}\left(\frac{1}{Y_iK_in_{ion}}+\frac{1}{K_an_R}\right)$$

where $E_I$ is reactive ion etch rate dominated by reactive ions, $n_{ion}$ is ion density and can be obtained from the plasma global model at step B2. In the formula, $K_i$ is an ion adsorption rate of the target layer (e.g., the light-shielding layer 250), and $Y_i$ is an ion desorption yield of the target layer (e.g., the light-shielding layer 250), in which $Y_iK_i$ is considered as ion-assisted desorption rate, in which $K_i$ can be obtained according to the material of the target layer (e.g., the light-shielding layer 250) by datasheet. The desorption yield ($Y_i$) can be described as follows:

$$Y_i\propto\sqrt{z_{eff}}\left(\sqrt{\varepsilon_i}-\sqrt{\varepsilon_{th}}\right)$$

where $z_{eff}$ is effective atom mass of collision particles (e.g., ions in plasma and active sites of the target layer, e.g., light-shielding layer 250), $\varepsilon_i$ is incident ion energy, and $\varepsilon_{th}$ is threshold energy. The incident ion energy ($\varepsilon_i$) can be calculated from the substrate biasing voltage and a plasma potential, in which the plasma potential can be calculated from electron density ($n_e$) and ion density ($n_{ion}$), which can be obtained at step B2. For example, the positive ions $P_i$ may be impinged on the target layer (e.g., light-shielding layer 250) by the ion rate ($K_i$), and the impinge of the positive ions $P_i$ on the target layer (e.g., light-shielding layer 250) may lead to ion-assisted desorption of volatile byproduct 250$_i$ by the ion-assisted desorption rate ($Y_iK_i$).

Based on the surface etch model developed from the chemical etch rate formula and the reactive ion etch rate formula, an etch performance can be estimated according to the material of the target layer (e.g., light-shielding layer 250) and the calculated plasma species density obtained from the plasma surface model at step B2. In some further embodiments, some IC layout information/factors (e.g., pattern loading effect, pattern density, pattern distribution) can be obtained/determined/calculated from the IC layout that determines the exposure of the lithography process at step S2 in FIG. 2. The pattern loading effect corresponds to issues between sparse and dense patterns, and may be related to line widths and line spaces. These IC layout information/factors (e.g., pattern loading effect) can be brought into the surface etch model, and have an impact on the estimation of the etch performance. In the context, the estimated etch performance may be represented as measurable quantities, such as critical dimension (CD) uniformity (e.g., 3 sigma), profile, damage, defect (or defectivity), the like, or the combination thereof.

At step B4, a determination is made if the estimated etch performance is acceptable. It determines whether to determine the provided dry etch control parameters as actual dry etch control parameters for etching the light-shielding layer 250 (step B5), or to adjust the provided dry etch control parameters (step B6) and return to the step B2. In some embodiments, the measurable quantities of the estimated etch performance may be compared with their corresponding threshold values, and the determination is made according to the comparing result. That is, an acceptable estimated etch performance is achieved when the measurable quantities of the estimated etch performance pass their corresponding threshold values, and an unacceptable estimated etch performance is obtained when the measurable quantities of the estimated etch performance do not pass their corresponding threshold values. The measurable quantities of the estimated etch performance, either individually or in combination, can be used for the determination.

In some embodiments, if the CD uniformity of the estimated etch performance is good and acceptable (for example, 3 sigma being less than a 3 sigma threshold value), the method M2 proceeds to step B5. If the CD uniformity of the estimated etch performance is poor and unacceptable (for example, 3 sigma being greater than a 3 sigma threshold value, the method M2 proceeds to the adjusting step B6. In some embodiments, the CD uniformity (e.g., 3 sigma) threshold value may be in a range from about 1 nanometer to about 10 nanometers.

For example, if the depth to width ratio of the estimated etch performance is greater than the profile threshold value, the method M2 proceeds to step B5. If the depth to width ratio of the estimated etch performance is lower than a profile threshold value, the method M2 proceeds to the adjusting step B6, and then the method M2 returns to step B2. The profile threshold value may be in a range from about 80 degrees to about 88 degrees.

For example, if the damage of the estimated etch performance is lower than a damage threshold value, the method M2 proceeds to step B5. If the damage of the estimated etch performance is greater than a damage threshold value, the method M2 proceeds to the adjusting step B6, and then the method M2 returns to step B2. The damage can be obtained by measuring a consumed thickness of the layer below the target layer, such as the buffer layer 240 below the light-shielding layer 250. The damage threshold value may be in a range from about several nanometers to several micrometers.

For example, if the defects of the estimated etch performance is lower than a defect threshold value, the method M2 proceeds to step B5. If the defect of the estimated etch performance is greater than a defect threshold value, the method M2 proceeds to the adjusting step B6, and then the method M2 returns to step B2. The defect threshold value may be in a range from about 15 defect counts to about 25 defect counts.

In the above examples, the measurable quantities of the estimated etch performance (e.g., CD uniformity, profile, damage, defect) are used individually for the determination. In some other examples, the measurable quantities of the estimated etch performance (e.g., CD uniformity, profile, damage, defect) are used in combination for the determination. For example, if three or more of the measurable quantities of the estimated etch performance pass their corresponding threshold values, the method M2 proceeds to the step B5. For example, if two or more of the measurable quantities of the estimated etch performance do not pass their corresponding threshold values, the method M2 proceeds to the adjusting step B6, and then the method M2 returns to step B2.

At step B5 where the estimated etch performance is acceptable, the provided dry etch control parameters are determined as actual dry etch control parameters. Accordingly, through the plasma global model and the surface etch model, the dry etch control parameters can be theoretically optimized at the early stage. The method M1 (referring to FIG. 2) may proceed to the step S4.

At step B6 where the estimated etch performance is not acceptable, the provided dry etch control parameters are adjusted according to the estimated etch performance. From the measurable quantities of the estimated etch performance, various indicators (e.g., a degree of anisotropic etching, plasma energy, etch selectivity, the like, or the combination thereof) may be determined for improvements. And, based on the indicators from the estimated etch performance, the plasma parameters can be retrieved by numerical method based on the surface etch model for adjusting the dry etch control parameters.

The degree of anisotropic etching is related to the competition of the vertical etching rate and lateral etching rate. A radical to ion density ratio may affect the vertical etching rate and lateral etching rate. In some examples, some estimated etch performance may indicate that a low degree of anisotropic etching is desired (e.g., higher radical to ion density ratio). These estimated etch performance may include poor CD uniformity (e.g., large 3 sigma), high depth to width ratio, the like, or the combination thereof. Thus, for achieving the low degree of anisotropic etching, the plasma parameters can be retrieved such that a high gas pressure and a low gas flow are used, thereby increasing the radical density ($n_R$) and decreasing ion density ($n_i$).

In some alternative examples, some estimated etch performance may indicate that a high degree of anisotropic etching is desired (e.g., a lower radical to ion density ratio). These estimated etch performance may include good CD uniformity (e.g., small 3 sigma), low depth to width ratio, the like, or the combination thereof. Thus, for achieving the high degree of anisotropic etching, the plasma parameters can be retrieved such that a low gas pressure and a high gas flow are used, thereby decreasing the radical density ($n_R$) and increasing ion density ($n_i$). In some other embodiments, when the estimated etch performance indicates that a high degree of anisotropic etching is desired (e.g., a lower radical to ion density ratio), substrate biasing is applied, for example, with a high voltage, thereby increasing the incident ion energy ($\varepsilon_i$) in the surface etch model.

Figure 7:
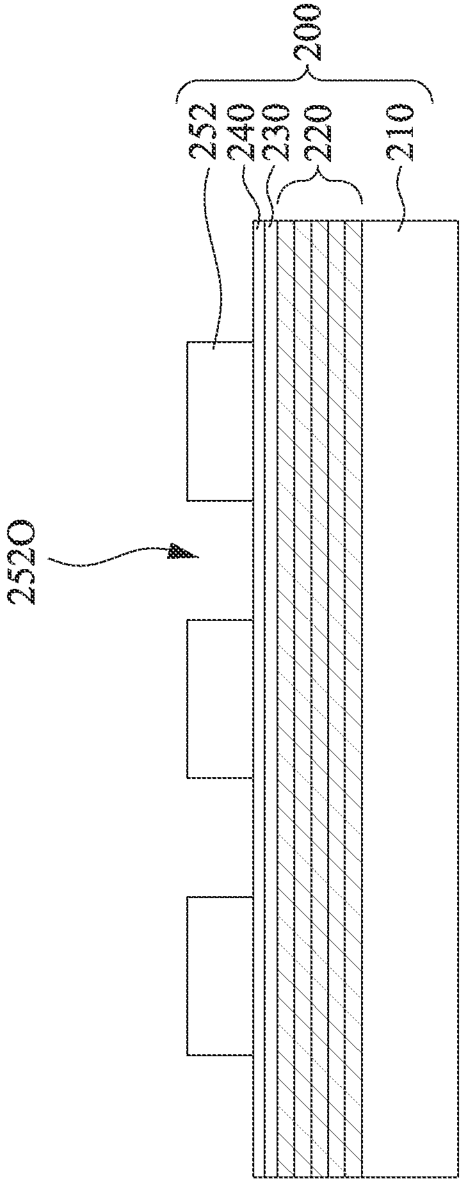

Through the etching process with the dry etch control parameters, the light-shielding layer 250 is patterned into a layer 252 having openings 252O, as the resulted structure shown in FIG. 7. The target layer 252 may cover portions of the buffer layer 240, the capping layer 230, and the reflective multi-layer 220, while the openings 252O may expose portions of the buffer layer 240, the capping layer 230, and the reflective multi-layer 220. Through openings 252O, a light beam may be sent to and reflected by the reflective multi-layer 220 without being absorbed by the layer 252. In FIG. 7, the layer 252, the buffer layer 240, the capping layer 230, the reflective multi-layer 220, and the substrate 210 form a reticle 200.

An example using Ar and chlorine plasmas is given. In a plasma model, for particle balance, collision process can be expressed as follows:

$$V\frac{dn}{dt} = -\sigma v n n_g = -Knn_g$$

where K is a rate coefficient, V is the plasma volume, σ is collision cross section, v is particle velocity, n is a particle density, and $n_g$ is a density of target layer.

The rate coefficient (K) can be represented below:

$$K=\langle\sigma(v)v\rangle_v=4\pi\int_0^\infty\sigma(v)v^3f(v)dv$$

where $f(v)$ is a Maxwell-Boltzmann speed distribution function.

$f(v)$ can be represented as follows:

$$f(v)=\left(\frac{m_e}{2\pi eT_e}\right)^{3/2}\exp\left(-\frac{m_ev^2}{2eT_e}\right)$$

$$\varepsilon=\frac{m_ev^2}{2e}$$

$$f(\varepsilon)=\frac{2}{\sqrt{\pi}}\frac{1}{T_e^{3/2}}\exp\left(-\frac{\varepsilon}{T_e}\right)$$

where $m_e$ is the mass of electron, $T_e$ is electron temperature.

Through the collision process and the Maxwell-Boltzmann speed distribution function, the rate coefficient (K) can be described as follows:

$$k=\int_0^\infty\sigma(\varepsilon)\left(\frac{8eT_e}{\pi m_e}\right)^{1/2}\frac{\varepsilon}{T_e}\exp\left(-\frac{\varepsilon}{T_e}\right)\frac{d\varepsilon}{T_e}$$

where k represents the rate coefficient (K).

Based on the aforementioned particle balance formula, various plasma species densities change rate (e.g., $Cl_2$ density change rate, Cl density change rate, negative ions (n_) change rate, electron density change rate, $Cl^+$ density change rate). The particle balance formulas are described as follows:

$$\frac{dn_{Cl_2}}{dt}=+\left[n\_n_{Cl_2^+}k_{rec_1}+\frac{Q_{Cl_2}}{V}-\frac{1}{2}n_{Cl}k_{wall}+\Gamma_{Cl_2^+}\frac{A}{V}\right]-\left[n_en_{Cl_2}(k_{i_1}+k_{i_2}+k_a+k_{dis}+k_{pair})+n_{Cl_2}k_{pump}\right]$$

$$n_en_{Cl_2}(k_{i_1}+k_{i_2}+k_a+k_{dis}+k_{pair})+n_{Cl_2}k_{pump}\Big]$$

$$\frac{dn_{Cl}}{dt}=+\left[n_en_{Cl_2}(k_{i_2}+k_a+2k_{dis})+2n\_n_{Cl}+k_{rec_2}+n\_n_{Cl_2}+k_{rec_1}\right]+\left[n_en\_k_{det}+\Gamma_{Cl}+\frac{A}{V}\right]-\left[n_en_{Cl}k_{i_3}+n_{Cl}(k_{pump}+k_{wall})\right]$$

$$\frac{dn\_}{dt}=+\left[n_en_{Cl_2}(k_a+k_{pair})\right]-\left[n\_n_{Cl_2}+k_{rec_1}+n\_n_{Cl}+k_{rec_2}+n_en\_k_{det}\right]$$

$$\frac{dn_e}{dt}=+\left[n_en_{Cl_2}(k_{i_1}+k_{i_2})+n_en_{Cl}k_{i_3}+n_en\_k_{det}\right]-n_en_{Cl_2}k_a+\Gamma_e\frac{A}{V}$$

$$\frac{dn_{Cl^+}}{dt}=+\left[n_en_{Cl_2}(k_{i_2}+k_{pair})+n_en_{Cl}k_{i_3}\right]-n\_n_{Cl}+k_{rec_2}+\Gamma_{Cl}+\frac{A}{V}\Big]$$

where $n_{Cl_2}$, $n_{Cl}$, $n_{Cl^+}$, n_, $n_e$, are species (number) density, in which $n_{Cl}$ serves as radical density in the plasma, and $n_{Cl^+}$ serves as ion density in the plasma, n_ (also can be denoted as $n_{Cl^-}$) serves as negative ion density in the plasma and may influence potential distribution and energy distribution in the plasma.

$$\Gamma_{Cl_2^+},\ \Gamma_{Cl^+},$$

and $\Gamma_e$, are incident particle flux to a surface of the target layer. A is area of the target layer. V is plasma volume. $Q_{Cl_2}$ is an amount of the reactive gas (e.g., $Cl_2$ gas), and $Q_{Cl_2}/V$ is a flow rate of the reactive gas (e.g., $Cl_2$ gas). $k_{i_1}$, $k_{i_2}$, $k_{i_3}$, $k_{rect1}$, $k_{rect2}$, $k_a$, $k_{dis}$, $k_{pair}$, $k_{dis}$, $k_{det}$, $k_{wall}$, and $k_{pump}$ are rate coefficients.

For example, $k_{dis}$ is a dissociation rate coefficient of the following chemical equation:

$$e+Cl_2(v=0)\rightarrow Cl+Cl+e.$$

For example, $k_{i_1}$ is a rate coefficient of the following chemical equation:

$$e+Cl_2(v=0)\rightarrow Cl_2^++2e.$$

For example, $k_{i_2}$ is a rate coefficient of the following chemical equation:

$$e+Cl_2(v=0)\rightarrow Cl+Cl^++2e.$$

For example, $k_a$ is an attachment rate coefficient of the following chemical equation:

$$e+Cl_2(v=0)\rightarrow Cl+Cl^-.$$

For example, $k_{pair}$ is a rate coefficient of the following chemical equation:

$$e+Cl_2(v=0)\rightarrow Cl^++Cl^-+e.$$

For example, $k_{rect2}$ is a recombination rate coefficient of the following chemical equation:

$$Cl^++Cl^-\rightarrow Cl+Cl$$

Where $k_{wall}$ is a rate coefficient of recombination at wall. $k_{pump}$ is a rate coefficient of gas pumping out, and may correspond to one of the dry etcher control parameters (i.e., pressure) controlled by the gas extraction system 850. $k_{det}$ is a detachment rate coefficient. $n_{Cl_2}k_{pump}$ may be a gas pump out rate. These rate coefficients ($k_{i_1}$, $k_{i_2}$, $k_{i_3}$, $k_{rect1}$, $k_{rect2}$, $k_a$, $k_{dis}$, $k_{pair}$, $k_{dis}$, $k_{det}$, $k_{wall}$, and $k_{pump}$) can be obtained from the equation of rate coefficients that are described with the collision process and the Maxwell-Boltzmann speed distribution function above, and not specifically shown herein.

Charge balance in quasi-neutral condition is described as follows:

$$n_{Cl}++n_{Cl_2}^{+}=n_e-n_-.$$

Figure 8:
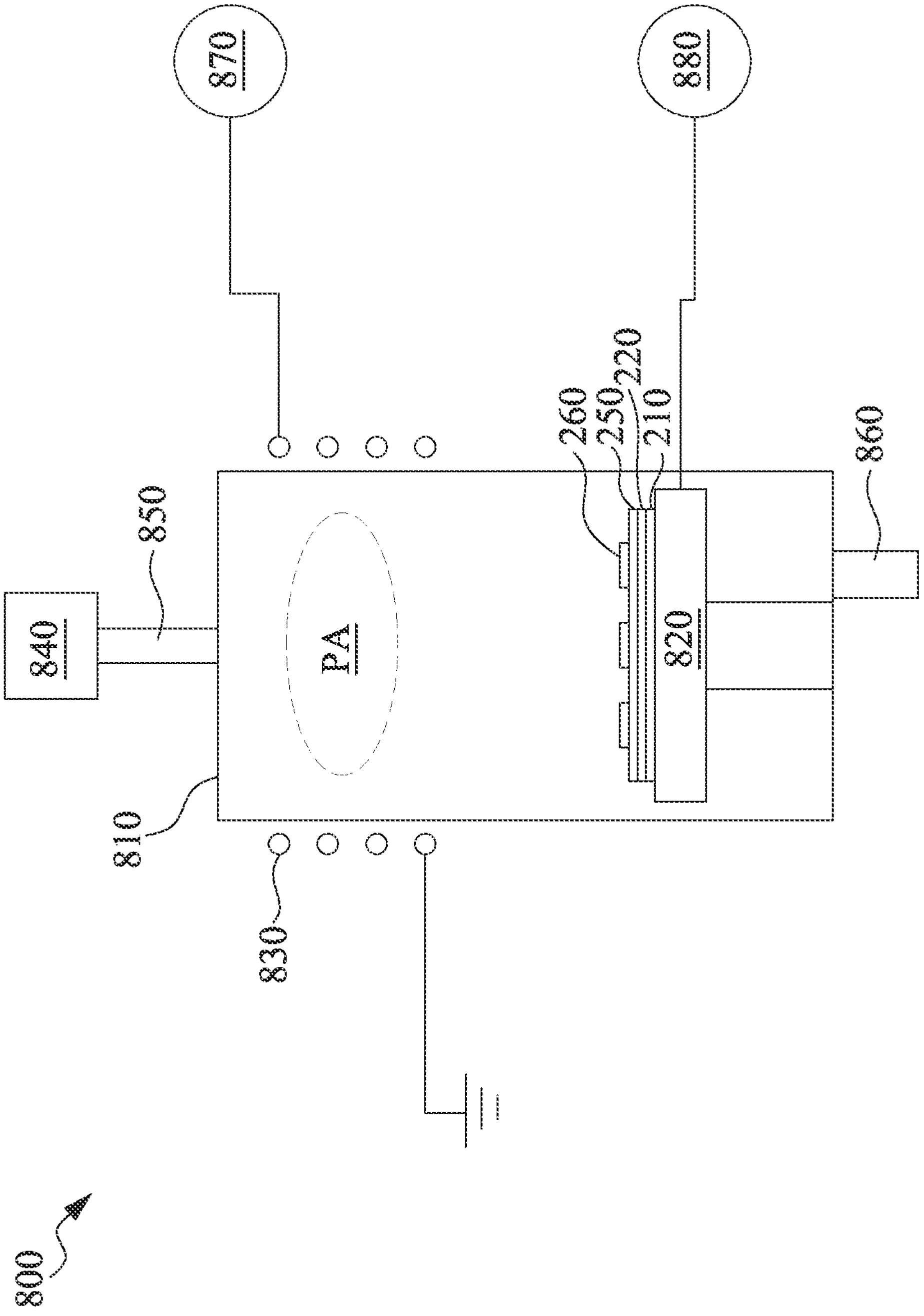
FIG. 8 is a schematic view of an exemplary dry etcher according to some embodiments of the present disclosure.

The above energy balance formula can also be described as follows:

$$\frac{d}{dt}\left(\frac{3}{2}n_eT_e\right)=P_{abs}-P_{loss}$$

where $T_e$ is electron temperature in electron-vols (eV), $P_{loss}$ is reaction energy loss per unit volume, $P_{abs}$ is absorption power per unit volume corresponds to the input power ($P_{in}$), which is controlled by the RF power supply 870 in FIG. 8.

Through the above particle balance formulas and charge balance formula, the energy balance formula can be obtained as follows:

$$P_{loss}=+n_en_{Cl}\left[k_{i_1}E_{i_1}+k_{i_2}E_{i_2}+k_aE_a+k_{dis}E_{dis}+k_{pair}E_{pair}+\sum_{1\le j\le 5}k_{ex_j}E_{ex_j}\right]+n_en_{Cl}\left[k_{i_3}E_{i_3}+\sum_{6\le j\le 11}k_{ex_j}E_{ex_j}\right]+n_e\mathrm{n\_k}_{det}E_{det}+\Gamma_e\frac{A}{V}(\Phi+2T_e)$$

Where $k_{ex}$ is excitation rate coefficient, $E_{ex}$ is excitation energy, $E_{dis}$ is dissociation energy, $E_i$, $E_{pair}$, $E_{det}$, and $E_a$ are corresponding chemical reaction energy. Through the equation, the plasma parameters (e.g., the plasma density, the ion flux, the ion energy, and the plasma reaction rate) can be retrieved by suitable numerical method (e.g., initial value problems). Φ is electrostatic potential.

FIG. 8 is a schematic view of an exemplary dry etcher 800 according to some embodiments of the present disclosure. The dry etcher 800 may include a chamber 810, a stage 820, a coil 830, a gas source 840, a gas delivery system 850, a gas extraction system 860, a radio frequency (RF) power 870, a substrate biasing source 880. The aforementioned dry etch control parameters (e.g., power (e.g., continuous waves), pulses, pressure, gas flow, gas type, substrate bias) may be assigned to these components of the dry etcher 800. For example, the gas type may be assigned to the gas source 840. The pressure and the gas flow may be assigned to the gas delivery system 850 and the gas extraction system 860. The power (e.g., continuous waves) and the pulses may be assigned to the RF power supply 870. The substrate bias may be assigned to the substrate biasing source 880.

In some embodiments, a plasma PA is generated in the chamber 810. The stage 820 may be disposed at the bottom portion of the chamber 810 for supporting the substrate 210. The coil 830 is disposed on an outer wall surface of the chamber 810 and connected to the RF power supply 870, which applies RF power. The gas source 840 may be configured to provide suitable gas types for process gas. The gas delivery system 850 may be connected between the gas source 840 and a gas inlet of the chamber 810, thereby introducing the process gas into the chamber 810. The gas delivery system 850 may include suitable mass flow controller (MFC) to control the gas flow. The gas extraction system 860 may connecting a pump to a gas outlet of the chamber 810, and may include valves to controlling the pressure in the chamber 810. The substrate biasing source 880 is connected to the stage 820 to apply bias power thereto.

A dry etching method using the dry etcher 800 is described. First, a substrate 210 is placed on the stage 820 in the chamber 810. Then, the chamber 810 is evacuated to a certain degree of vacuum. Subsequently, a process gas is introduced through the gas delivery system 850 into the chamber 810. The gas extraction system 860 may adjust the pressure of the process gas in the chamber 810, for example, by opening or closing an exhaust valve, till the pressure of the process gas becomes equal to the predetermined value. Then, the RF power 870, which applies power to the coil 830, is used for generating the plasma PA of the process gas and adjusting the plasma density. The substrate biasing source 880, which applies bias voltage to the stage 820, is used for drawing ions (etching species) from the plasma PA into the substrate 210 to be etched, for example, by controlling the incident ion energy ($\varepsilon_i$).

In some embodiments, an exemplary dry etcher is shown in FIG. 8 as an inductively coupled plasma (ICP) etcher. In some other embodiments, the dry etcher may be a capacitively coupled plasma (CCP) etcher, a transformer coupled plasma (TCP) etcher, a dielectric barrier discharge (DBD) plasma etcher, or the like.

Figure 9:
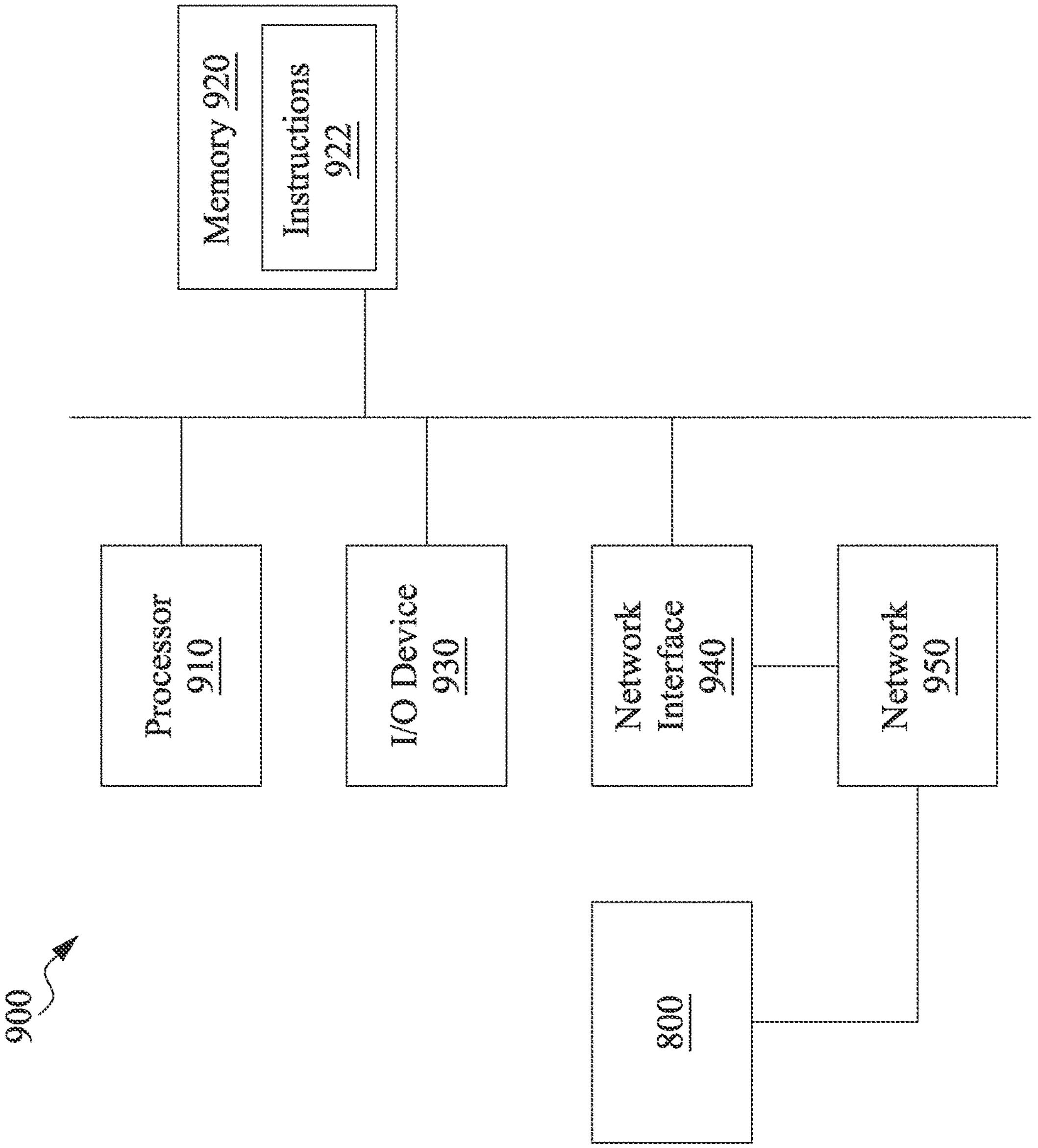
FIG. 9 is a block diagram of a controller module, in accordance with some embodiments.

FIG. 9 shows a block diagram of a controller module, in accordance with some embodiments. The controller 900 generates output control signals (e.g., dry etch control parameters) for controlling operations of components of the dry etcher 800, in accordance with some embodiments. In some embodiments, the controller 900 includes a processor 910, a memory 920, an input/output (I/O) device 930, and a network interface 940 each communicatively coupled via an interconnection communication mechanism.

The processor 910 is arranged to execute and/or interpret one or more set of instructions 922 stored in the memory 920. In some embodiments, the processor 910 is a central processing unit (CPU), a multi-processor, a distributed processing system, an application specific integrated circuit (ASIC), and/or a suitable processing unit. The processor 910 may utilize the logic of proportional-integral-derivative (DIP) to determine control parameters of elements of the dry etcher 800, such as the gas delivery system 850, the gas extraction system 860, the RF power supply 870, and the substrate biasing source 880.

The I/O device 930 is coupled to external circuitry. In some embodiments, the I/O device 930 includes a keyboard, keypad, mouse, trackball, trackpad, and/or cursor direction keys for communicating information and commands to the processor 910.

The memory 920 (also referred to as a computer-readable medium) includes a random access memory or other dynamic storage device, communicatively coupled to the bus for storing data and/or instructions for execution by the processor 910. In some embodiments, the memory 920 is used for storing temporary variables or other intermediate information during execution of instructions to be executed by the processor 910. In some embodiments, the memory 920 also includes a read-only memory or other static storage device coupled to the bus for storing static information and instructions for the processor 910. In some embodiments, the memory 920 is an electronic, magnetic, optical, electromagnetic, infrared, and/or a semiconductor system (or apparatus or device). For example, the memory 920 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 920 includes a compact disk-read only memory (CD-ROM), a compact disk-read/write (CD-R/W), and/or a digital video disc (DVD). The memory 920 may store information in relation to the plasma global model and the surface etch model. For example, the memory 920 may store the aforementioned particle balance formula, the aforementioned energy balance formula, the aforementioned chemical etch rate formula, and the aforementioned reactive ion etch rate formula.

In some embodiments, the memory 920 is encoded with, e.g., storing, the computer program code, e.g., a set of executable instructions 922, for performing the method M1 and M2 (referring to FIGS. 2 and 3). Therefore, the processor 910 can performed the method M1 and the step B1-B6 of the method M2 stored in the memory 920. In some embodiments, the memory 920 stores information for performing the method M1 and the step B1-B6 of the method M2 (referring to FIGS. 2 and 3), such as IC layout, a material of target layer, various rate coefficients from data sheet, the provided dry etch control parameters (referring to step B1 in FIG. 3), or the like. In some embodiments, the memory 920 also stores information generated during performing the method M1 and M2 (referring to FIGS. 2 and 3), such as the determined dry etch control parameters (referring to step B5 in FIG. 3), the estimated etch performance (referring to step B3 in FIG. 3), or the like. In some embodiments, the memory 920 is encoded with, e.g., storing, the computer program code, e.g., a set of executable instructions 922, for controlling one or more components of the dry etcher 800 to perform the step S4 in the method M1.

The network interface 940 includes a mechanism for connecting to a network 950, to which one or more other computer systems are connected. In some embodiments, the network interface 940 includes a wired and/or wireless connection mechanism. The network interface 940 includes wireless network interfaces such as BLUETOOTH, WIFI, WIMAX, GPRS, or WCDMA; or wired network interface such as ETHERNET, USB, or IEEE-1394. In some embodiments, the controller 900 is coupled with one or more components of the dry etcher 800 via the network interface 940. In some embodiments, the controller 900 is directly coupled with one or more components of the dry etcher 800, e.g., with the components coupled to the bus instead of via the network interface 940.

Figure 10:
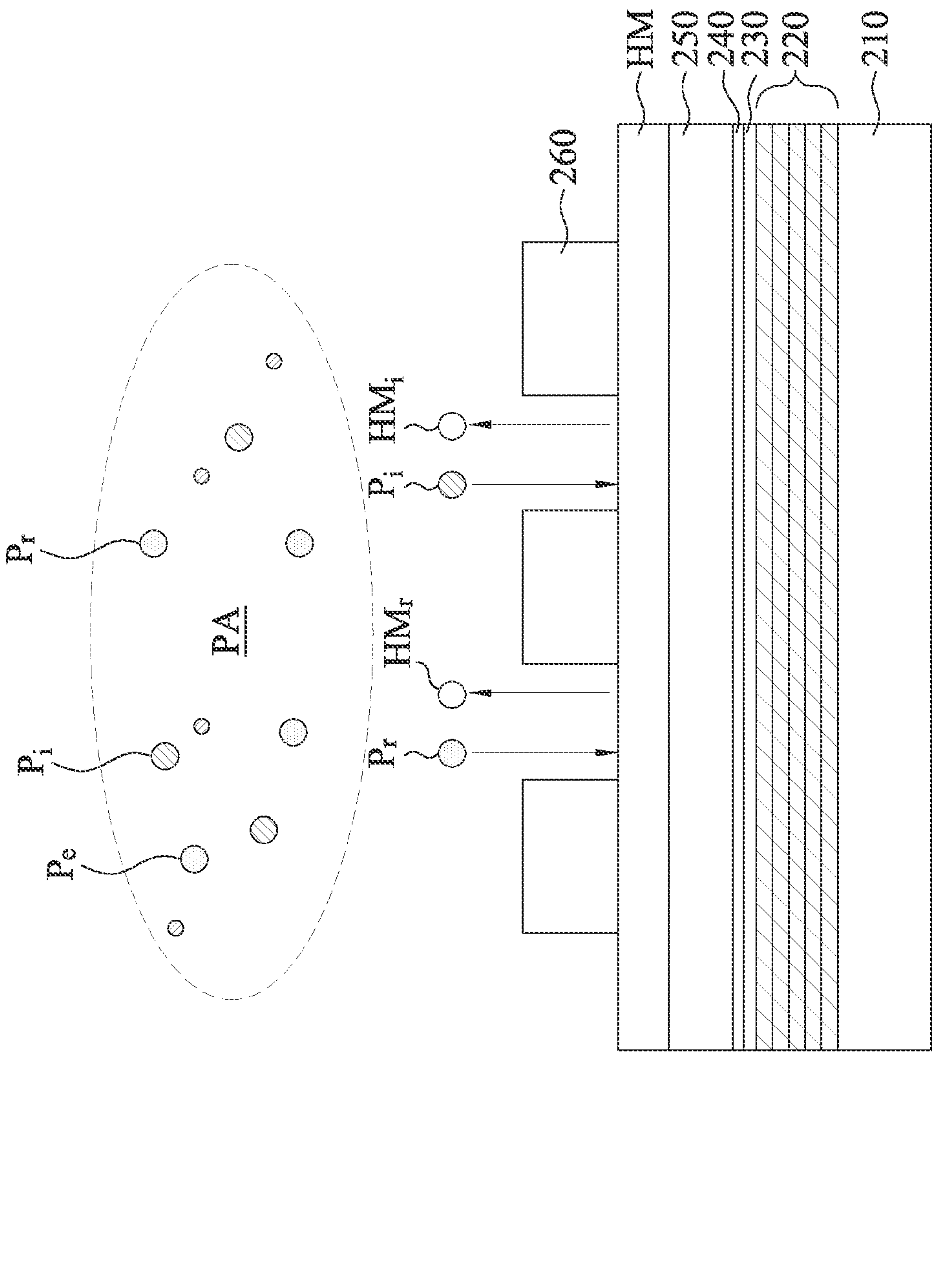
FIGS. 10-12 are cross-sectional views illustrating a method for fabricating a reticle used in the lithography system according to some embodiments of the present disclosure.
Figure 11:
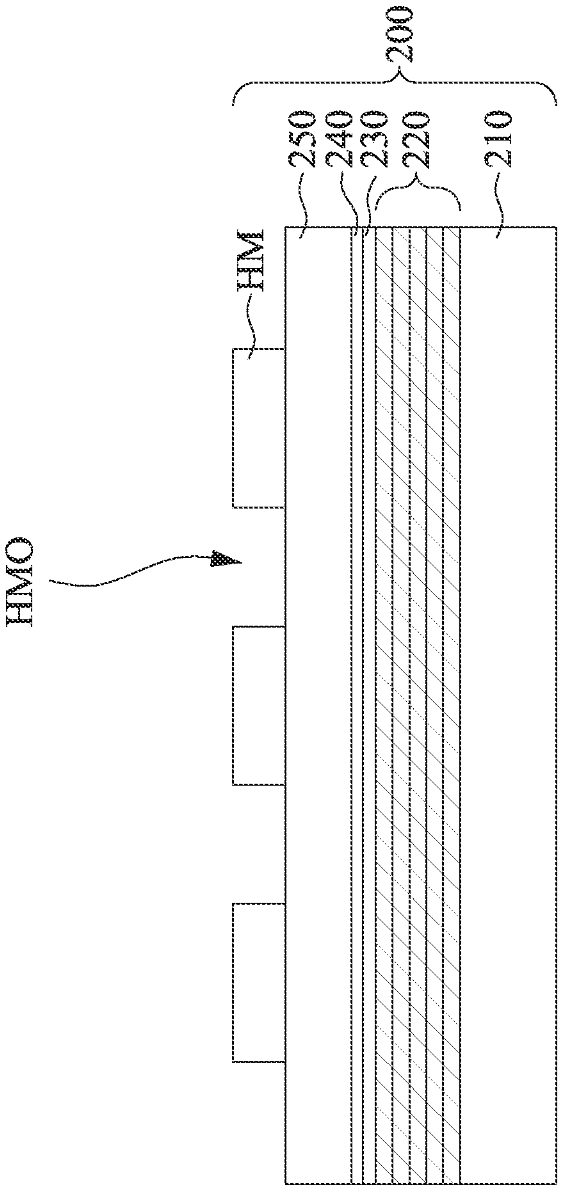
Figure 12:
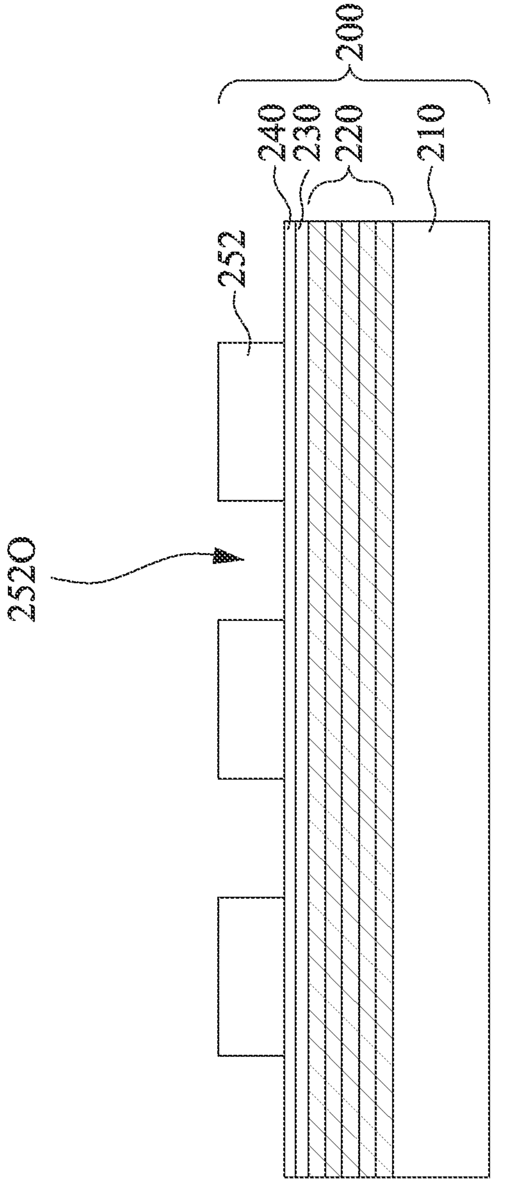

FIGS. 10-12 are cross-sectional views illustrating a method for fabricating a reticle used in the lithography system according to some embodiments of the present disclosure. The method M1 (referring to FIG. 2) may be used. Details of the present embodiments are similar to that of FIGS. 4-7, except that a hard mask layer serves as the target layer in the present embodiments. It is understood that additional steps may be provided before, during, and after the steps shown in FIGS. 10-12, and some of the steps described below can be replaced or eliminated for additional embodiments of the method. The order of the operations/processes may be interchangeable.

Reference is made to FIG. 10. As the step S1 of method M1 (referring to FIG. 2), a hard mask layer HM is formed over the light-shielding layer 250, and the hard mask layer HM may serve as the target layer. The hard mask layer HM may include suitable dielectric materials, such as silicon nitride, silicon oxide, silicon oxynitride, silicon carbide, the like, or the combination thereof. As the step S2 of method M1 (referring to FIG. 2), a lithography process is performed to form a patterned photoresist layer 260 over the target layer (e.g., the hard mask layer HM). Details regarding the substrate 210, the layers 220-250, and the photoresist layer 260 are similar to that of FIGS. 4-7, and thereto not repeated herein.

As the step S3 of method M1 (referring to FIG. 2), dry etch control parameters are determined based on the method M2 (referring to FIG. 3), and the target layer (e.g., the hard mask layer HM) is etched when a dry etcher is set up with the dry etch control parameters. In the present embodiments, the dry etcher generates plasma PA to etch the hard mask layer HM. The plasma PA may include various species, such as negative electrons $P_e$, neutral radicals $P_r$, and positive ions $P_i$. The neutral radicals $P_r$ may be impinged on the hard mask layer HM, and the impinge of the neutral radicals $P_r$ may lead to desorption of volatile byproduct $HM_r$. The positive ions $P_i$ may be impinged on the hard mask layer HM, and the impinge of the positive ions $P_i$ on the light-shielding layer 250 may lead to ion-assisted desorption of volatile byproduct $HM_i$. When the hard mask layer HM is made of silicon-based material, the byproducts $HM_r$ and $HM_i$ may be $SiCl_4$. Through the etching process with the dry etch control parameters, the target layer (e.g., the hard mask layer HM) is patterned into a layer HM having openings HMO, as the resulted structure shown in FIG. 11.

Reference is made to FIG. 12. An etching process is performed to the light-shielding layer 250 using the layer HM as etch mask. Portions of the light-shielding layer 250 exposed by the openings HMO are removed, and portions of the light-shielding layer 250 covered by the layer HM are protected from the etching process. Through the etching process, the light-shielding layer 250 is patterned into a layer 252 having openings 252O. The layer HM may be removed by suitable removal process after the etching process.

Figure 13:
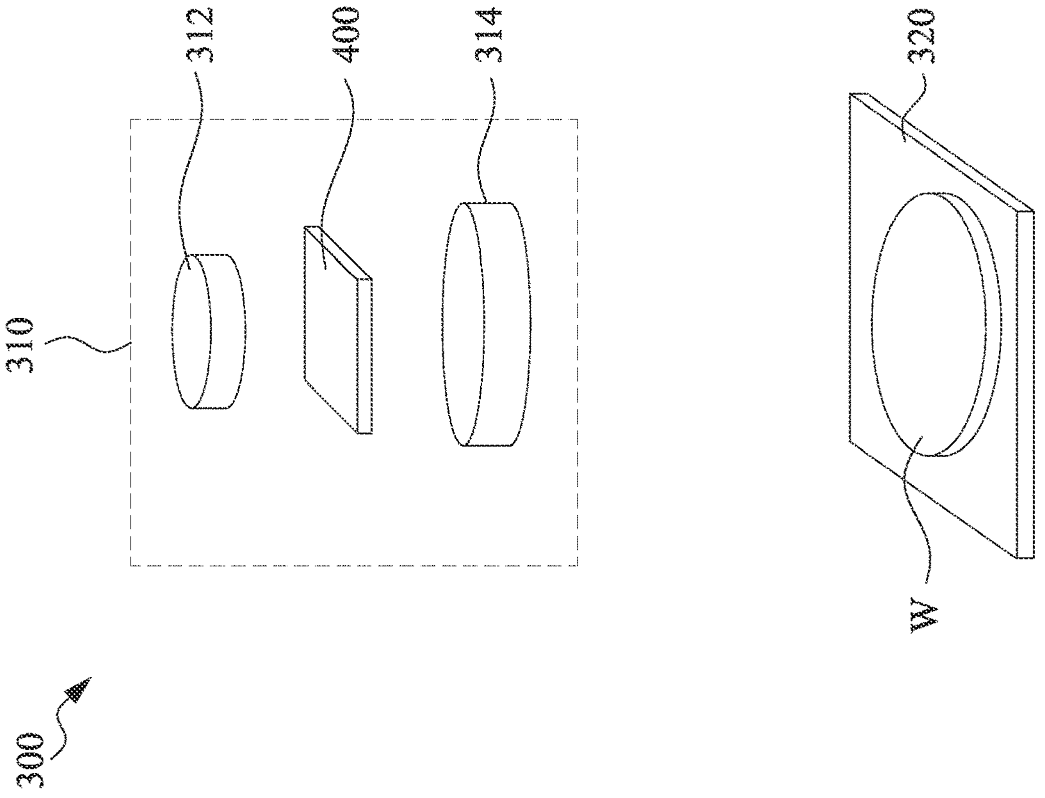
FIG. 13 is a schematic view of a lithography system according to some embodiments of the present disclosure.

FIG. 13 is a schematic view of a lithography system 300 according to some embodiments of the present disclosure. Details of the lithography system 300 in the present embodiments are similar to the lithography system 100 of FIG. 1, except that a transmissive reticle/mask 400 is used in the present embodiments. The lithography system 300 includes an exposure tool 310 and a stage 320. The exposure tool 310 is used to perform a lithography exposure process to a resist layer coated on the wafer W. The exposure tool 310 includes a radiation source 312, a reticle 400, and an optical module 314. The radiation source 312 is configured to provide a radiation energy to the wafer W. The reticle 400 is configured to provide the radiation energy from the radiation source 312 with a pattern. The optical module 314 is configured to modulate and direct the radiation energy having the pattern to the wafer W. The stage 320 holds the wafer W.

In some embodiments, the radiation source 312 may be any radiation source suitable for exposing a resist layer. In various examples, the radiation source 322 may include a light source selected from the group consisting of ultraviolet (UV) source, deep UV (DUV) source, extreme UV (EUV) source, and X-ray source.

In the present embodiments, the reticle 400 may include a transparent substrate and a patterned absorption layer. The transparent substrate may use fused silica ($SiO_2$) relatively free of defects, such as borosilicate glass and soda-lime glass. The absorption layer may include a metal film such as chromium (Cr) for absorbing light directed thereon. The absorption layer is further patterned to have one or more openings in the metal film through which a light beam may travel without being completely absorbed.

The optical module 314 may be designed to have a refractive mechanism. In a refractive mechanism, the optical module 314 includes various refractive components, such as lenses. In some other embodiments, the optical module 314 may include a reflective mechanism, the optical module 314 includes various reflective components, such as mirrors. Other details of the present embodiments may be similar to that of FIG. 1, and not repeated herein.

Figure 14:
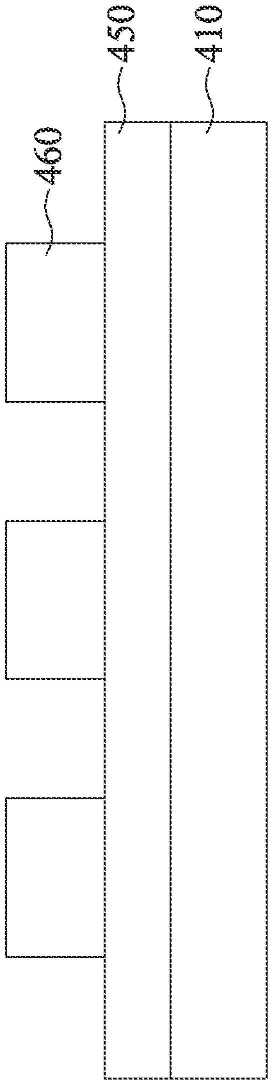
FIGS. 14-16 are cross-sectional views illustrating a method for fabricating a reticle used in the lithography system according to some embodiments of the present disclosure.
Figure 15:
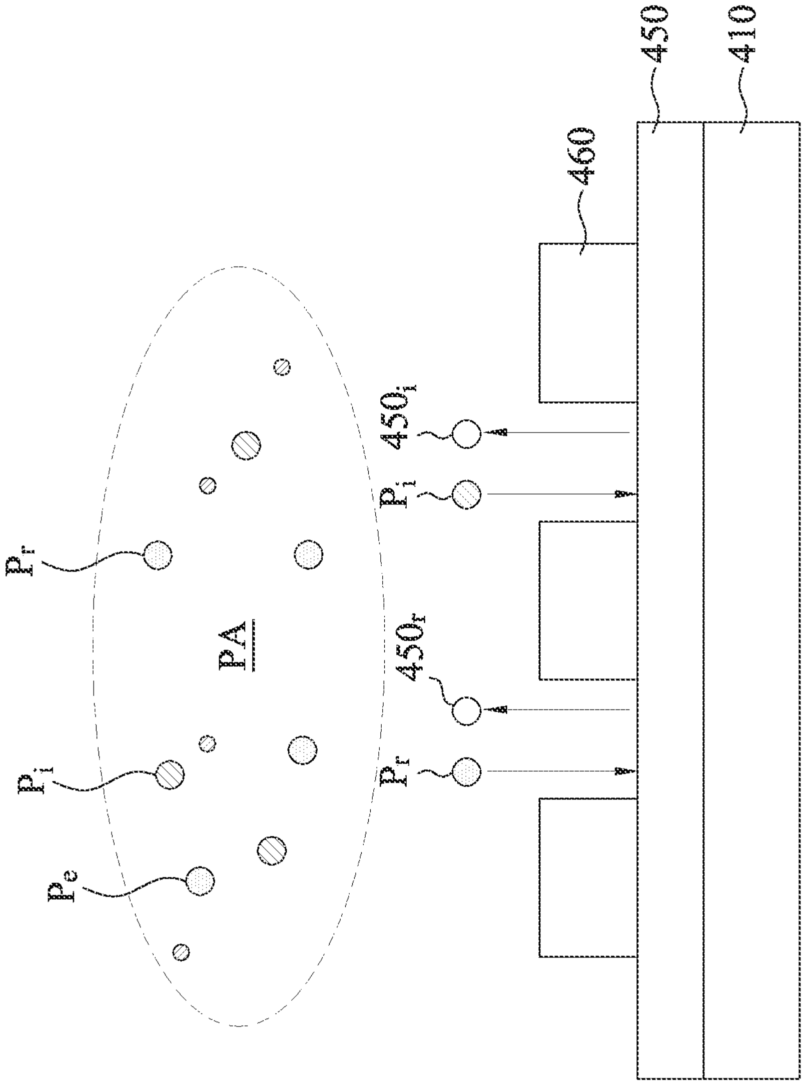
Figure 16:
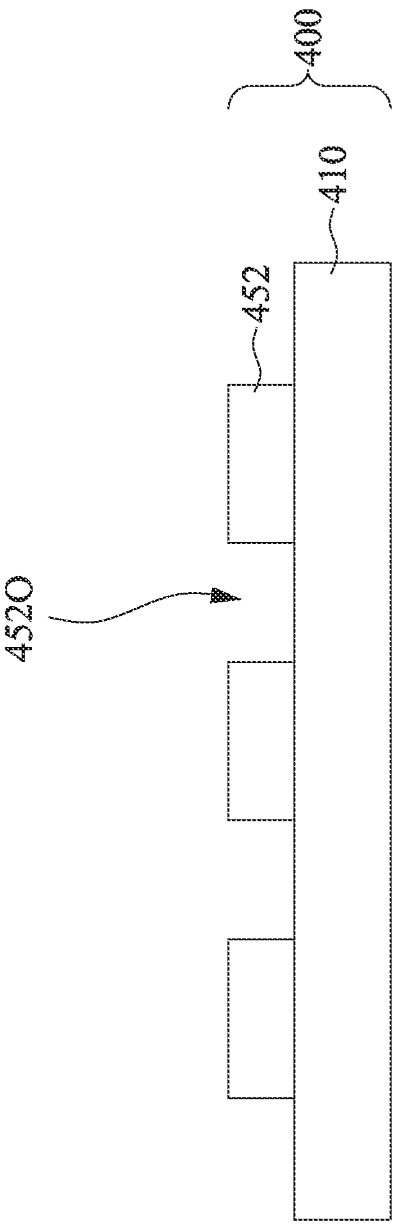

FIGS. 14-16 are cross-sectional views illustrating a method for fabricating a reticle used in the lithography system 300 (referring to FIG. 3) according to some embodiments of the present disclosure. Details of the present embodiments are similar to that of FIG. 1, except that a transmissive reticle/mask 400 is fabricated in the present embodiments. The method M1 (referring to FIG. 2) may be applicable in the present embodiments. It is understood that additional steps may be provided before, during, and after the steps shown in FIGS. 14-16, and some of the steps described below can be replaced or eliminated for additional embodiments of the method. The order of the operations/processes may be interchangeable.

Reference is made to FIG. 14. As the step S1 of the method M1 (referring to FIG. 2), a target layer may be formed over a substrate 410. The substrate 410 may be a dielectric substrate. In some embodiments, for the transmissive optical lithography system, the substrate 410 may be a transparent substrate, which may have a transmittance greater than about 60%, or even greater than about 80%, at the operating wavelength range of the lithography system 300 (referring to FIG. 13). For example, the substrate 410 may use fused silica ($SiO_2$) relatively free of defects, such as borosilicate glass and soda-lime glass.

A light-shielding layer 450 may be deposited over the substrate 410. In some embodiments, the light-shielding layer 450 may be a layer capable of reflecting and/or absorbing light directed thereon. For example, at the operating wavelength range of the lithography system 300 (referring to FIG. 13), a transmittance of the light-shielding layer 450 is lower than about 40%, or even lower than about 20%. For example, at the operating wavelength range of the lithography system 300 (referring to FIG. 13), an absorbance and/or reflectance of the light-shielding layer 450 is greater than about 60%, or even greater than about 80%. The light-shielding layer 450 may include a metal film such as chromium (Cr), the like, or the combination thereof for absorbing light directed thereon. In the present embodiments, the light-shielding layer 450 may serve as the target layer. In some alternative embodiments (illustrated later in FIGS. 17-19), a hard mask layer formed over the light-shielding layer 450 over the substrate 410 may serve as the target layer. For example, the target layer may include silicon or silicon-based material (e.g., silicon nitride or silicon oxide).

The light-shielding layer 450 may be formed by suitable deposition method, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), the like and/or other methods.

As the step S2 of method M1 (referring to FIG. 2), a lithography process is performed to form a patterned photoresist layer 460 over the target layer (e.g., light-shielding layer 450). The lithography process may include resist coating (e.g., spin-on coating), soft baking, exposure, post-exposure baking, developing the resist, rinsing, drying (e.g., hard baking), other suitable processes, and/or combinations thereof. The exposure may include a maskless exposure process, such as laser exposure, electron beam direct writing, or multiple electron beam direct writing. In some embodiments, an IC layout is obtained and/or determined prior the lithography process, and the exposure of the lithography process is performed according to the IC layout, thereby providing a light pattern to the resist.

Reference is made to FIG. 15. As the steps S3 and S4 of method M1 (referring to FIG. 2), dry etch control parameters are determined based on the method M2 (referring to FIG. 3), and the target layer (e.g., light-shielding layer 450) is etched when a dry etcher is set up with the dry etch control parameters. In the present embodiments, the dry etcher generates plasma PA is generated to etch the light-shielding layer 450. The plasma PA may include various species, such as negative electrons $P_e$, neutral radicals $P_r$, and positive ions $P_i$. The neutral radicals $P_r$ may be impinged on the light-shielding layer 450), and the impinge of the neutral radicals $P_r$ may lead to desorption of volatile byproduct 450$_r$. The positive ions $P_i$ may be impinged on the light-shielding layer 450, and the impinge of the positive ions $P_i$ on the light-shielding layer 450 may lead to ion-assisted desorption of volatile byproduct 450$_i$. When the light-shielding layer 450 is made of tantalum, the byproduct 450$_r$ and 450$_i$ may be $TaCl_5$. Through the etching process with the dry etch control parameters, the target layer (e.g., light-shielding layer 450) is patterned into a layer 452 having openings 452O, as the resulted structure shown in FIG. 16. In FIG. 16, the layer 452 and the substrate 410 form a reticle 400.

Figure 17:
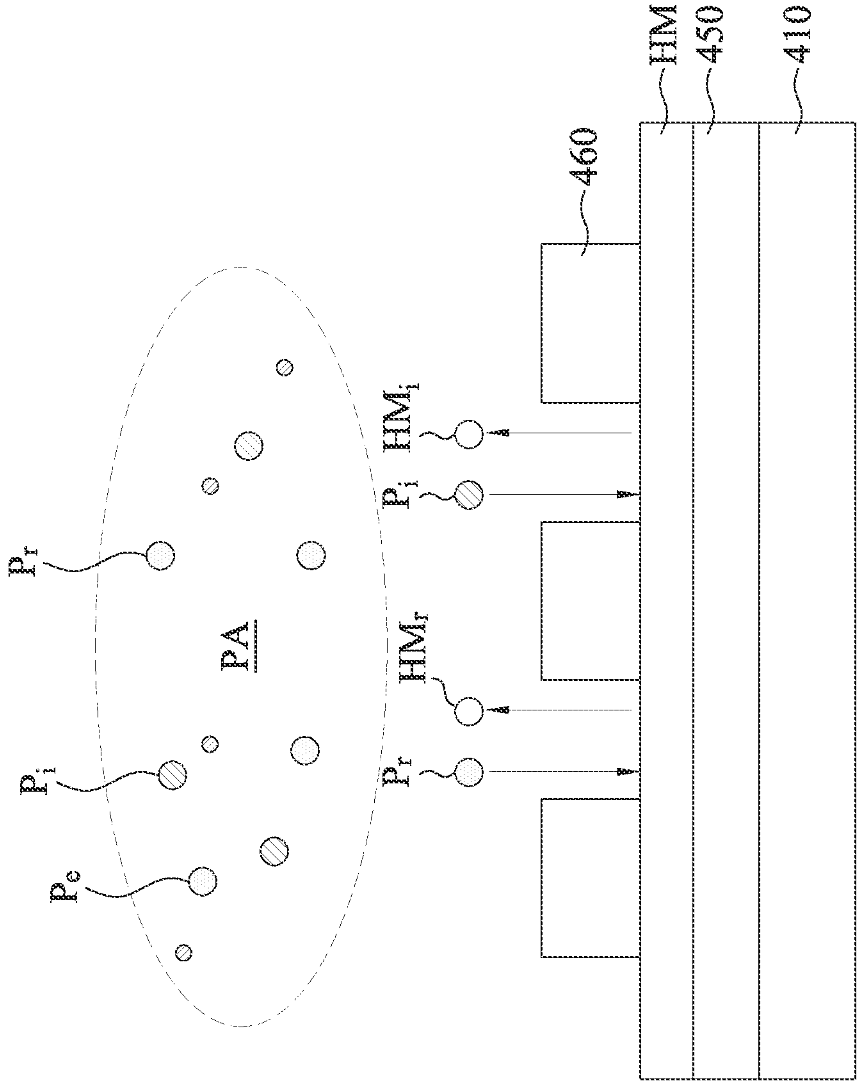
FIGS. 17-19 are cross-sectional views illustrating a method for fabricating a reticle used in the lithography system according to some embodiments of the present disclosure.
Figure 18:
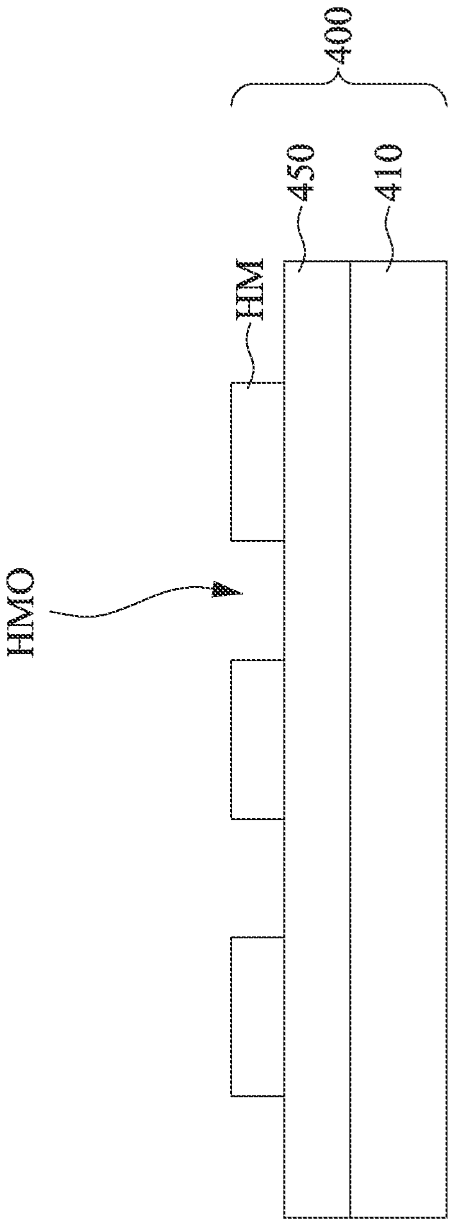
Figure 19:
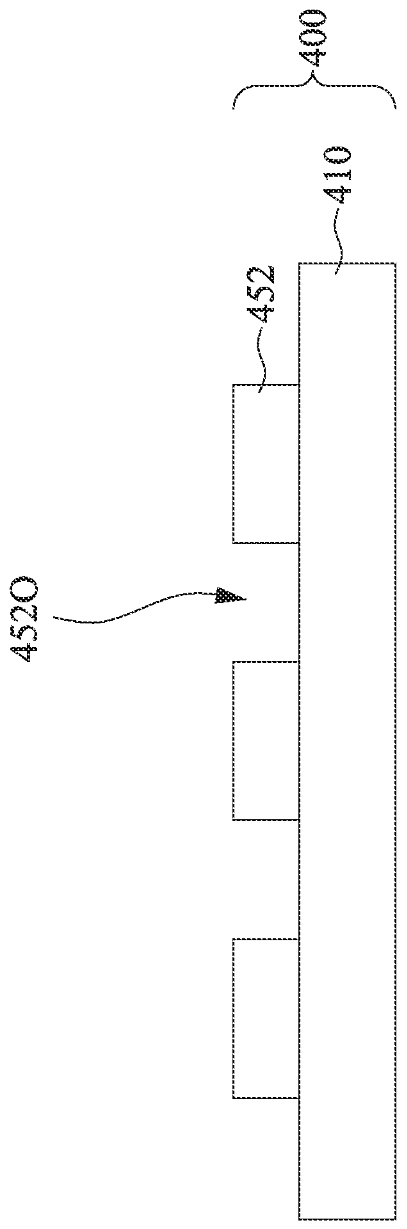

FIGS. 17-19 are cross-sectional views illustrating a method for fabricating a reticle used in the lithography system according to some embodiments of the present disclosure. The method M1 (referring to FIG. 2) may be used. Details of the present embodiments are similar to that of FIGS. 14-16, except that a hard mask layer serves as the target layer in the present embodiments. It is understood that additional steps may be provided before, during, and after the steps shown in FIGS. 17-19, and some of the steps described below can be replaced or eliminated for additional embodiments of the method. The order of the operations/processes may be interchangeable.

Reference is made to FIG. 17. As the step S1 of method M1 (referring to FIG. 2), a hard mask layer HM is formed over the light-shielding layer 450. The hard mask layer HM may serve as the target layer. The hard mask layer HM may include suitable dielectric materials, such as silicon nitride, silicon oxide, silicon oxynitride, silicon carbide, the like, or the combination thereof. As the step S2 of method M1 (referring to FIG. 2), a lithography process is performed to form a patterned photoresist layer 460 over the target layer (e.g., the hard mask layer HM). Details regarding the substrate 410, the light-shielding layer 450, and the photoresist layer 460 are similar to that of FIGS. 14-16, and thereto not repeated herein.

As the step S3 of method M1 (referring to FIG. 2), dry etch control parameters are determined based on the method M2 (referring to FIG. 3), and the target layer (e.g., the hard mask layer HM) is etched when a dry etcher is set up with the dry etch control parameters. In the present embodiments, the dry etcher generates plasma PA is generated to etch the hard mask layer HM. The plasma PA may include various species, such as negative electrons $P_e$, neutral radicals $P_r$, and positive ions $P_i$. The neutral radicals $P_r$ may be impinged on the hard mask layer HM, and the impinge of the neutral radicals $P_r$ may lead to desorption of volatile byproduct $HM_r$. The positive ions $P_i$ may be impinged on the hard mask layer HM, and the impinge of the positive ions $P_i$ on the hard mask layer HM may lead to ion-assisted desorption of volatile byproduct $HM_i$. When the hard mask layer HM is made of silicon-based material, the byproducts $HM_r$ and $HM_i$ may be $SiCl_4$. Through the etching process with the dry etch control parameters, the target layer (e.g., the hard mask layer HM) is patterned into a layer HM having openings HMO, as the resulted structure shown in FIG. 18.

Reference is made to FIG. 19. An etching process is performed to the light-shielding layer 450 using the layer HM as etch mask. Portions of the light-shielding layer 450 exposed by the openings HMO are removed, and portions of the light-shielding layer 450 covered by the layer HM are protected from the etching process. Through the etching process, the light-shielding layer 450 is patterned into a layer 452 having openings 452O. After the etching process, the layer HM may be removed by suitable removal process, such as nitride removing process.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the optimization flow with the plasma global model and the surface etch model can provide a strategy based on fundamental theory. The plasma global model provides clear relations between fundamental mechanisms and plasma parameters. The surface etch model gives the connection between the plasma parameters and etch performance; such like CD uniformity, profile, damage, and defect. With the flow, the etch process optimization is performed with solid physical or chemical theories. It thus converges much fast and less costly. Another advantage is that the optimization flow can be used for mask fabrication, thereby saving mask fabrication time and effectiveness.

According to some embodiments of the present disclosure, a method includes depositing a target layer over a dielectric substrate; forming a patterned photoresist layer over the target layer according to an integrated circuit (IC) layout; determining a plurality of dry etch control parameters according a material of the target layer and an information of the IC layout; and using a dry etcher set up with the dry etch control parameters, etching the target layer through the patterned photoresist layer.

According to some embodiments of the present disclosure, a method includes depositing a target layer over a dielectric substrate; performing a lithography process to form a patterned photoresist layer over the target layer; performing a first estimation operation to estimate an etch performance based on a plurality of initial dry etch control parameters; determining whether the estimated etch performance estimated in the first estimation operation is acceptable; in response to the determination determines that the estimated etch performance in the first estimation operation is not acceptable, adjusting the initial dry etch control parameters to generate adjusted dry etch control parameters; performing a second estimation operation to estimate an etch performance based on the adjusted dry etch control parameters; determining whether the estimated etch performance estimated in the second estimation operation is acceptable; and in response to the determination determines that the estimated etch performance in the second estimation operation is acceptable, etching the target layer through the patterned photoresist layer using a dry etcher set up with the adjusted dry etch control parameters.

According to some embodiments of the present disclosure, a method includes forming a reflective multi-layer over a dielectric substrate; depositing a light absorption layer over the reflective multi-layer; forming a patterned photoresist layer over the light absorption layer; determining a plurality of initial dry etch control parameters, wherein determining the initial dry etch control parameters comprises choosing a gas type as one of the initial dry etch control parameters based on a material of the light absorption layer; estimating a critical dimension uniformity of an etch performance according to the initial dry etch control parameters; adjusting the initial dry etch control parameters according to the critical dimension uniformity of the etch performance to generate adjusted dry etch control parameters; and using a dry etcher set up with the adjusted dry etch control parameters, etching the light absorption layer through the patterned photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing a target layer over a dielectric substrate;

forming a patterned photoresist layer over the target layer according to an integrated circuit (IC) layout;

executing a modeling process configured to simulate a plasma behavior and a surface etch behavior based on a material of the target layer and an information of the IC layout, wherein the plasma behavior is simulated by calculating plasma species densities comprising a radical density and an ion density based on a plasma global model established by solving a particle balance formula and an energy balance formula using a plurality of provided dry etch control parameters, wherein the particle balance formula considers a species generation rate and a species loss rate, and wherein the surface etch behavior is simulated based on a surface etch model established with a chemical etch rate formula and a reactive ion etch rate formula, wherein the calculated radical density is brought into the chemical etch rate formula to estimate a chemical etch rate, and the calculated ion density is brought into the reactive ion etch rate formula to estimate a reactive ion etch rate;

determining, from results of the modeling process, a plurality of dry etch control parameters based on the estimated chemical etch rate and the estimated reactive ion etch rate; and after executing the modeling process, using a dry etcher set up with the dry etch control parameters to etch the target layer through the patterned photoresist layer.

2. The method of claim 1, wherein the dry etch control parameters comprise at least one of a power, a gas flow, a pressure, a gas type, and a pulse.

3. The method of claim 1, wherein the information of the IC layout comprises a loading effect information.

4. The method of claim 1, wherein determining the dry etch control parameters comprises:

estimating an etch performance based on the estimated chemical etch rate and the estimated reactive ion etch rate;

when the etch performance is acceptable, determining the provided dry etch control parameters as the dry etch control parameters; and when the etch performance is not acceptable, adjusting the provided dry etch control parameters, and returning to estimating the etch performance.

5. The method of claim 1, wherein the target layer is a light shielding layer.

6. The method of claim 1, further comprising:

forming a reflective multi-layer over the dielectric substrate prior to forming the target layer.

7. The method of claim 1, wherein the dielectric substrate is a transparent substrate.

8. The method of claim 1, wherein solving the particle balance formula and the energy balance formula comprises calculating rate coefficients for chemical reactions in the plasma behavior by using a Maxwell-Boltzmann speed distribution function.

9. A method comprising:

depositing a target layer over a dielectric substrate;

performing a lithography process to form a patterned photoresist layer over the target layer;

performing a first estimation operation to estimate a first etch performance based on a plurality of initial dry etch control parameters, wherein the first estimation operation comprises executing a modeling process that simultaneously simulates a plasma behavior within an etch chamber and surface etch reactions at a feature level in an integrated modeling framework, wherein the plasma behavior is simulated by calculating plasma species densities comprising a radical density and an ion density based on a plasma global model established by solving a particle balance formula and an energy balance formula using the plurality of initial dry etch control parameters, wherein the particle balance formula considers a species generation rate and a species loss rate, and wherein the surface etch reactions are simulated based on a surface etch model established with a chemical etch rate formula and a reactive ion etch rate formula, wherein the calculated radical density is brought into the chemical etch rate formula to estimate a chemical etch rate, and the calculated ion density is brought into the reactive ion etch rate formula to estimate a reactive ion etch rate, wherein the first etch performance estimated in the first estimation operation is a simulated first etch performance generated by the modeling process based on the estimated chemical etch rate and the estimated reactive ion etch rate, the simulated first etch performance comprising at least one of a critical dimension uniformity, a profile characteristic, a defect, or a damage;

determining whether the estimated first etch performance estimated in the first estimation operation is acceptable;

in response to the determination determines that the estimated first etch performance in the first estimation operation is not acceptable, adjusting the initial dry etch control parameters to generate adjusted dry etch control parameters;

performing a second estimation operation to estimate a second etch performance based on the adjusted dry etch control parameters;

determining whether the estimated second etch performance estimated in the second estimation operation is acceptable; and in response to the determination determines that the estimated second etch performance in the second estimation operation is acceptable, etching the target layer through the patterned photoresist layer using a dry etcher set up with the adjusted dry etch control parameters.

10. The method of claim 9, wherein the initial dry etch control parameters comprise at least one of a power, a gas flow, a pressure, a gas type, and a pulse.

11. The method of claim 9, further comprising:

prior to performing the first estimation operation, choosing a gas type as one of the initial dry etch control parameters based on a material of the target layer.

12. The method of claim 9, wherein adjusting the initial dry etch control parameters comprises:

determining a degree of anisotropic etching based on the estimated chemical etch rate and the estimated reactive ion etch rate; and adjusting the initial dry etch control parameters based on the degree of anisotropic etching.

13. The method of claim 9, wherein the lithography process comprises a maskless exposure process.

14. The method of claim 9, wherein the target layer is a metal layer.

15. The method of claim 9, wherein the target layer is a hard mask layer.

16. The method of claim 9, wherein depositing the target layer is performed such that the target layer has a substantially flat top surface.

17. The method of claim 9, wherein the modeling process further calculates an incident ion energy based on a plasma potential, and the plasma potential is calculated from an electron density and the ion density obtained from the modeling process.

18. A method comprising:

forming a reflective multi-layer over a dielectric substrate;

depositing a light absorption layer over the reflective multi-layer;

forming a patterned photoresist layer over the light absorption layer;

determining a plurality of initial dry etch control parameters, wherein determining the initial dry etch control parameters comprises choosing a gas type as one of the initial dry etch control parameters based on a material of the light absorption layer, wherein the plurality of initial dry etch control parameters comprise chamber pressure, RF power, and gas flow rate values directly derived from results of a modeling process and configured as recipe setpoints, and the modeling process simulates a plasma behavior by calculating plasma species densities comprising a radical density and an ion density based on a plasma global model established by solving a particle balance formula and an energy balance formula using the initial dry etch control parameters, wherein the particle balance formula considers a species generation rate and a species loss rate, and simulates a surface etch behavior based on a surface etch model established with a chemical etch rate formula and a reactive ion etch rate formula for the light absorption layer, wherein the calculated radical density is brought into the chemical etch rate formula to estimate a chemical etch rate, and the calculated ion density is brought into the reactive ion etch rate formula to estimate a reactive ion etch rate;

estimating, by the modeling process, a critical dimension uniformity of an etch performance according to the initial dry etch control parameters based on the estimated chemical etch rate and the estimated reactive ion etch rate;

adjusting the initial dry etch control parameters according to the critical dimension uniformity of the etch performance to generate adjusted dry etch control parameters; and using a dry etcher set up with the adjusted dry etch control parameters, etching the light absorption layer through the patterned photoresist layer.

19. The method of claim 18, wherein depositing the light absorption layer comprises tantalum.

20. The method of claim 18, wherein the surface etch model estimates the reactive ion etch rate based on an ion desorption yield of the light absorption layer, the ion desorption yield being calculated according to an effective atom mass of collision particles between ions in a plasma and active sites of the light absorption layer.

* * * * *